(12) United States Patent
Barnett et al.

(10) Patent No.: US 7,138,667 B2
(45) Date of Patent: *Nov. 21, 2006

(54) HIGH POWER LIGHT EMITTING DIODE

(75) Inventors: Thomas J. Barnett, Powell, OH (US); Sean P. Tillinghast, Bexley, OH (US)

(73) Assignee: Weldon Technologies, Inc., Hilliard, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/114,991

(22) Filed: Apr. 26, 2005

(65) Prior Publication Data

US 2005/0194607 A1 Sep. 8, 2005

(51) Int. Cl.
*H01L 29/22* (2006.01)
(52) U.S. Cl. .......................... 257/99; 257/676
(58) Field of Classification Search .......... 257/98–100, 257/666, 667, 676
See application file for complete search history.

(56) References Cited

U.S. PATENT DOCUMENTS

| | | | | |
|---|---|---|---|---|
| 5,266,817 A * | 11/1993 | Lin | ............................. | 257/89 |
| 6,069,440 A | 5/2000 | Shimizu et al. | ............. | 313/486 |
| 6,274,924 B1 * | 8/2001 | Carey et al. | ................. | 257/676 |
| 6,517,218 B1 * | 2/2003 | Hochstein | .................... | 362/294 |
| 6,541,800 B1 * | 4/2003 | Barnett et al. | ................. | 257/98 |
| 6,561,680 B1 * | 5/2003 | Shih | ........................... | 362/294 |
| 6,590,235 B1 | 7/2003 | Carey et al. | ................... | 257/98 |
| 6,733,711 B1 * | 5/2004 | Durocher et al. | ....... | 264/272.14 |
| 6,903,380 B1 * | 6/2005 | Barnett et al. | ................. | 257/98 |
| 6,917,057 B1 * | 7/2005 | Stokes et al. | ................. | 257/98 |

* cited by examiner

*Primary Examiner*—Mark V. Prenty
(74) *Attorney, Agent, or Firm*—James R. Eley; Michael A. Forhan; Eley Law Firm Co.

(57) ABSTRACT

An LED package is disclosed. The LED package comprises a base contact and a leadframe connected to the base contact. The leadframe includes an annular contact. An LED die is coupled to the base contact and the annular contact. A trim bezel is coupled to the leadframe. In various embodiments the LED package may include a lens, and an optical material disposed over the LED die. The trim bezel may be colored to generally indicate the color of light emitted by the LED die.

31 Claims, 22 Drawing Sheets

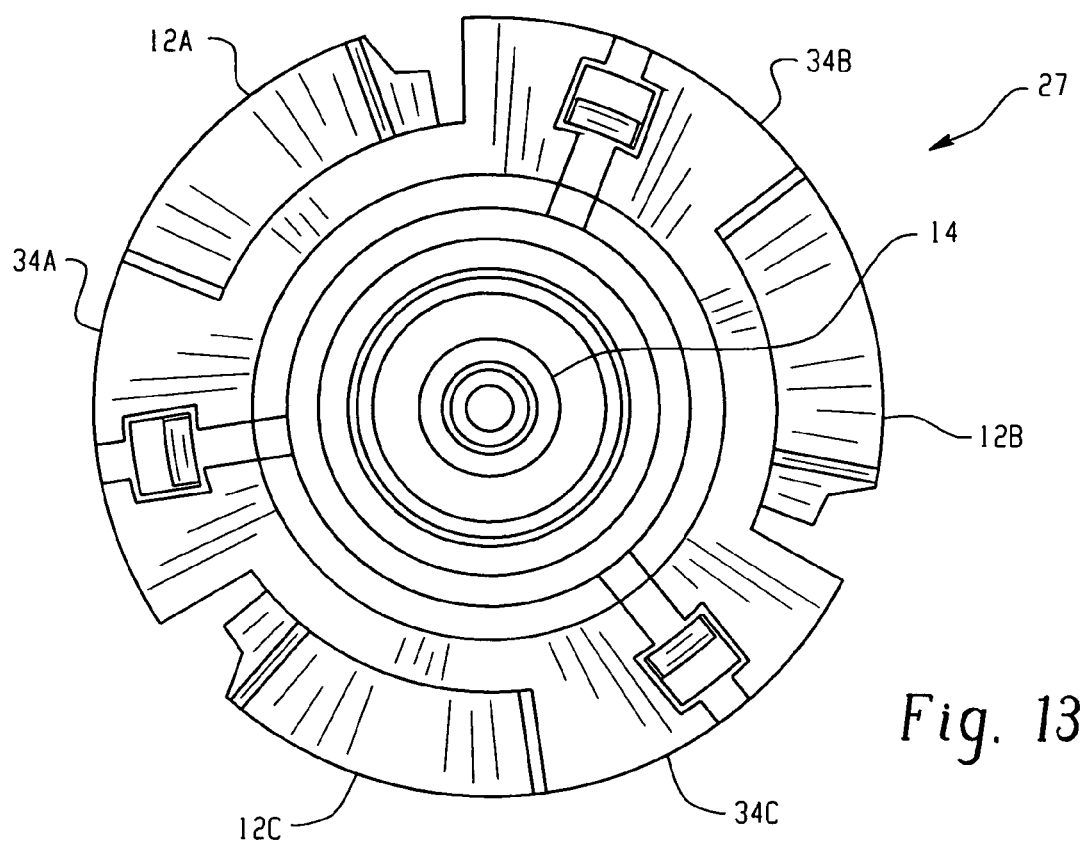
Fig. 13A
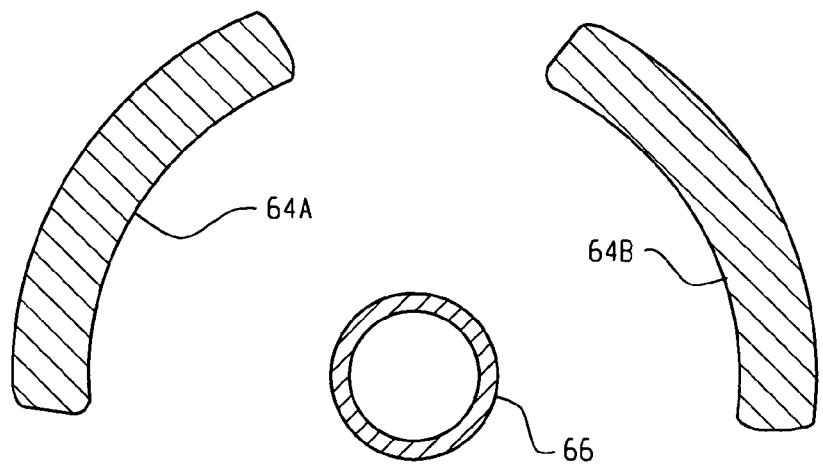
Fig. 13B
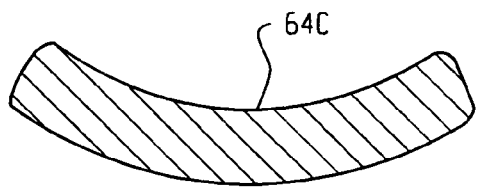

HIGH POWER LIGHT EMITTING DIODE

This application claims the benefit of U.S. patent application Ser. No. 10/411,707, filed Apr. 11, 2003, now U.S. Pat. No. 6,903,380, the contents of which are hereby incorporated by reference.

FIELD OF THE INVENTION

The embodiments of the present invention relate generally to packaging for light emitting diodes ("LEDs"). One aspect of the embodiments may be to produce an optically efficient LED that can generate a higher degree of illumination per unit area than is currently available in the art. Another aspect of the embodiments may be to provide a means of mechanically attaching the device to a light fixture or printed circuit board. Yet another aspect of the embodiments may be to provide an improved package for LEDs and a method for packaging multiple LEDs on strips, to better facilitate automated manufacturing methods for assemblies utilizing the LEDs. Still another aspect of the embodiments may be to provide a means of producing a white light from a single LED package. Yet another aspect of the embodiments may be to provide a means of mounting multiple LED dice within a single LED package.

PRIOR ART

The art of manufacturing the light emitting component of LEDs is widely described in the art and well known to those so skilled. Furthermore, the art of producing white LEDs is well known and described in the art. Pertinent patents include: U.S. Pat. No. 5,813,752 issued to Singer et al. on Sep. 29, 1998, entitled "UV/Blue LED-Phosphorus Device With Short Wave Pass, Long Wave Pass Band Pass and Peroit Filters," which describes the use of a layered blue/UV LED semiconductor having a top layer of phosphor and filters for producing white light; U.S. Pat. Nos. 5,998,925 and 6,069,440 issued to Shimizu et al. on Dec. 7, 1999 and May 30, 2000, respectively and each entitled "Light Emitting Device. Having A Nitride Compound Semiconductor And A Phosphor Containing A Garnet Fluorescent Material," which describe the design of white LEDs that utilize blue LEDs to excite a layer of phosphor material comprising garnet fluorescent materials activated with cerium and/or including the use of dispersing materials surrounding the phosphor containing components to diffuse the resulting illumination.

The structural makeup of various LED packages are also disclosed in the technical data sheets of a number of commercial LED manufacturers, see for example, the technical data sheets for "Super Flux" LEDs, by LumiLeds (a joint venture between Philips Lighting and Agilent Technology); "SnapLED 150" LEDs, by LumiLeds; "Six LED High Mount Stop Light Array," by LumiLeds; "Luxeon Star," by LumiLeds; and "Shark Series High Flux LED Illuminators," by Opto Technology, Inc.

BACKGROUND OF THE INVENTION

A light emitting diode (LED) is a compact semiconductor device that generates light of various colors when a current is passed through it. The color depends primarily upon the chemical composition of the light emitting components of the LED die. LEDs exhibit various advantages over incandescent, fluorescent, and discharge light sources, including smaller size, longer life, lower power requirements, good initial drive characteristics, high resistance to vibration and high tolerance to repeated power switching. Because of these favorable characteristics LEDs are widely used in such applications as indicators and low-power lighting applications.

Recently red, green and blue ("RGB") LEDs having high luminance and efficiencies have been developed and employed as pixel elements in large screen LED displays and signs. This type of LED display can be operated with less power consumption than the prior art, such as incandescent lamps, and has additional favorable characteristics such as light weight and long life. Demand for LEDs as an alternative to prior art display pixel elements is burgeoning.

Although LEDs are more efficient than prior art light sources, they are not 100% efficient in converting electrical energy to light. As a result, a great deal of heat can be produced by the LED die. If the heat is not adequately dissipated, mechanical stress is imposed on various internal components of the LED due to the differing coefficients of thermal expansion of the internal components. This stress can lead to failure of the LED. Therefore, heat sinks are often employed to dissipate heat generated by the LED. The heat sink is usually provided through the metal leadframe of the LED.

The amount of heat generated by the LED becomes an even greater concern as higher-power LEDs are developed for high-brightness applications. Some manufacturers have produced more powerful LEDs having large heat sinks but at a trade-off. First, if an LED with a large heat sink is soldered using conventional methods (i.e. wave solder, reflow solder), the heat from the soldering process is transferred to the LED die, which may cause failure of the LED. Second, if the LED is soldered using non-conventional techniques (i.e. bar soldering or laser soldering), this must generally be performed by the LED manufacturer due to the heat sensitive nature of the process. Therefore, the LED manufacturer often provides a high power LED as a prepackaged component. Unfortunately, the configuration of the package may not be compatible with the physical space requirements of the intended end product design.

In addition, optical coupling of the LED to an associated lens is inefficient. Generally, an LED consists of a semiconductor die adhered to a substrate using an optically clear epoxy. This direct interface of the die (which has a typical index of refraction "n" of about 3.40) to the epoxy (having a typical index of refraction "n" of about 1.56) creates a significant index of refraction gradient between the two materials. As light travels from a medium of high index of refraction to low index of refraction, Fresnel losses are experienced due to the inability of the light to escape the package as a result of internal reflection. Therefore, a material or a layer of material that minimizes the index of refraction gradient is desired to decrease the Fresnel losses that would otherwise occur.

Furthermore, because the epoxy used to encapsulate the conventional LED die is generally rigid when fully cured, thermal expansion of the LED components can cause a degree of shear and tensile stress on the bonds between the bonding wires that connect between the electrical contacts and the LED die. A means of reducing stress on the bonding wires as a result of thermal expansion of the LED components is needed.

It will be recognized by one skilled in the art that the various embodiments and features disclosed above with regard to FIGS. 1–17 including, but not limited to, spring contacts having a differing diametral pitch, embodiments wherein the LED die is a plurality of LED dice, a segmented annular contact, LED contact connections, types and styles of base contacts, and coupling of the LED die to the base contact are all equally applicable to LED package 610. Accordingly, those embodiments and features will not be repeated here. Furthermore, in the various embodiments of FIGS. 1–21 the LED package may utilize any of the means disclosed herein for detachably coupling to at least one of a mounting device, a receiving device and a complementary coupling device as detailed above, including, without limitation, one or more of lens protrusions 32 (see, e.g., FIGS. 2, 3 and 5); bayonet protrusions 470 (FIGS. 15A, 15B); and threads 570, 626 (FIGS. 16A, 16B, 18 and 19).

SUMMARY

One embodiment of the present invention provides a system comprising an LED package. The LED package comprises at least one LED die. The LED die is a semiconductor diode having an N-type semiconductor material portion joined to a P-type semiconductor material portion at a "P-N junction." When electrical energy is applied to the LED die such that electrons flow from the N-type material portion to the P-type material portion, light is emitted from the die. An electrical contact connected to the P-type material portion is called an "anode" and the electrical contact connected to the N-type material portion is called a "cathode." The anode and/or cathode contacts may be annular in shape. The anode and/or cathode contacts may be incorporated into a leadframe having coupling devices adapted to assemble the LED package onto a PCB or into a product. The LED die and a lens are coupled to the leadframe. The LED package may also comprise an optical material located in a cavity defined by the lens and the leadframe.

Another embodiment of the present invention provides a system comprising a mounting device and an LED package. The LED package comprises a leadframe having an annular contact with a central opening and a heat sink adjacent the central opening, an LED die coupled to the heat sink and annular contact, and a lens coupled to the leadframe. The lens comprises protrusions that are utilized to mechanically secure the LED package to the mounting device. The LED package further comprises an optical material located in a cavity defined by the lens and the leadframe.

Another embodiment of the present invention provides a method for making a system with an LED package. The making of the LED package comprises the steps of: a) providing a leadframe having an annular contact with a concentric opening and a heat sink with a die cup, b) coupling at least one LED die to the die cup of the heat sink, c) coupling the LED die to the annular contact through the concentric opening, d) dispensing an optical material into a cavity defined by the lens, the annular contact, and the heat sink, and e) coupling a lens to the leadframe.

Another embodiment provides a system comprising an LED package. The LED package comprises two or more contacts, any of which may be annularly shaped. The LED package also comprises at least one LED die coupled to the contacts and a lens coupled to the contacts. The LED package also comprises a cavity defined by the lens and the contacts.

Another embodiment of the present invention provides a system comprising an LED package. The LED package comprises an anode contact coupled with a cathode contact. The LED package also comprises at least one LED die coupled to the cathode contact and the anode contact and a lens coupled to one or both of the contacts. The LED package also comprises an optical material located in a cavity defined by the lens, the cathode contact, and the anode contact.

Another aspect may be that the optical material is a gel, a grease, a viscous material, a rigid material, a resilient material, a non-resilient material, a liquid material or a non-liquid material.

Another aspect may be that the system comprises a mounting device, where the LED package is mechanically coupled to the mounting device via the lens.

Another aspect may be that the system comprises a mounting device, where the LED package is mechanically coupled to the mounting device via the base contact.

Another aspect may be that the system further comprises an anode strip comprising an array of contacts utilized to form an array of the LED packages and a carrier strip comprising receiving devices to receive the array of LED packages.

Another aspect may be that a portion of the lens is either coated with or comprises light excitable material such that the system emits white light. Another aspect may be that an optical material such as silicone or viscous material includes light excitable material such that the system emits white light.

Another aspect may be that a plurality of LED dice are used.

Another aspect may be that the annular contact is segmented to allow isolated contact to each LED die in the package.

Another aspect may be that the segmented annular contact is arranged in a manner such that the flexible extensions have differing diametral pitches to provide isolated contact to each flexible extension while maintaining radial symmetry.

Another aspect may be that a plurality of LED die with insulating substrate are used. The LED die are electrically connected in series to one another, to the annular contact and the base contact via wire bonding.

BRIEF DESCRIPTION OF THE DRAWINGS

Further features of the present invention will become apparent to those skilled in the art to which the present embodiments relate from reading the following specification and claims, with reference to the accompanying drawings, in which:

FIG. 13A is a plan view of an LED package showing an embodiment of the flexible extensions and base contact for connecting electrical power;

FIG. 13B is a plan view of electrical contacts on a PCB or a mounting device that correspond to the flexible extensions and base contact of FIG. 13A according to an embodiment of the present invention;

DESCRIPTION OF THE PREFERRED EMBODIMENT(S)

Figure 1:
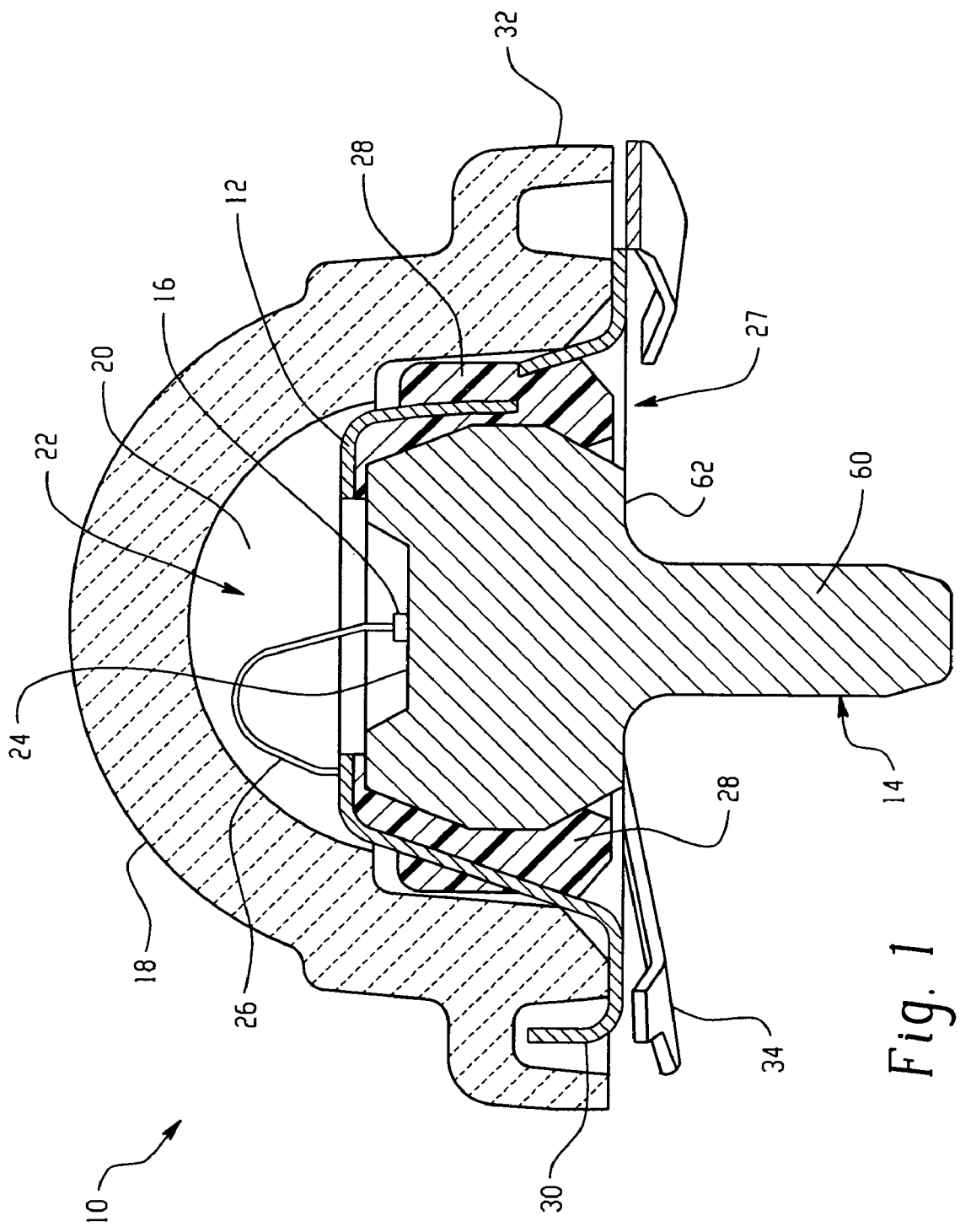
FIG. 1 is a cross sectional view of one embodiment of an LED package.

With reference to FIGS. 1–4, an LED package 10 of a system 100 is shown. The LED package 10 comprises an annular contact 12, a base contact, 14, an LED die 16, and a lens 18. The annular contact 12 and base contact 14 may each be configured as either an anode or as a cathode for the LED die 16, as desired. An optical material 20 may be located in a cavity 22 defined by the annular contact 12, the base contact 14, and the lens 18. The optical material 20 may be a silicone material, a gel or grease, a non-resilient material, a non-liquid material, or the like. In other embodiments the cavity 22 may contain a liquid, viscous, resilient, rigid or solid optical material 20 or may not contain any material. The optical material 20 may be "UV-stable" to resist degradation due to exposure to ultraviolet radiation, such as from sunlight.

The LED die 16 may be coupled to the annular contact 12 via a wire bonding 26. The LED die 16 may also be coupled to a die cup 24 of the base contact 14 by solder or a thermally and electrically conductive adhesive, such as an epoxy. The die cup 24 may have reflective surfaces to aid in the distribution of light emitted by the LED die 16. A leadframe 27 may be assembled by coupling the base contact 14 to the annular contact 12 through use of a coupling material 28, which may be liquid crystal polymer or the like, so long as the material is thermally conductive and electrically insulating. After dispensing the optical material 20 into the cavity 22, the lens 18 is coupled to the leadframe 27 via complementary coupling devices 30 which may be, for example, barbs or tabs, and coupling devices 31 which may be, for example, receiving openings. In another embodiment, the lens 18 may be coupled to the leadframe 27 with an adhesive, such as an epoxy.

Figure 2:
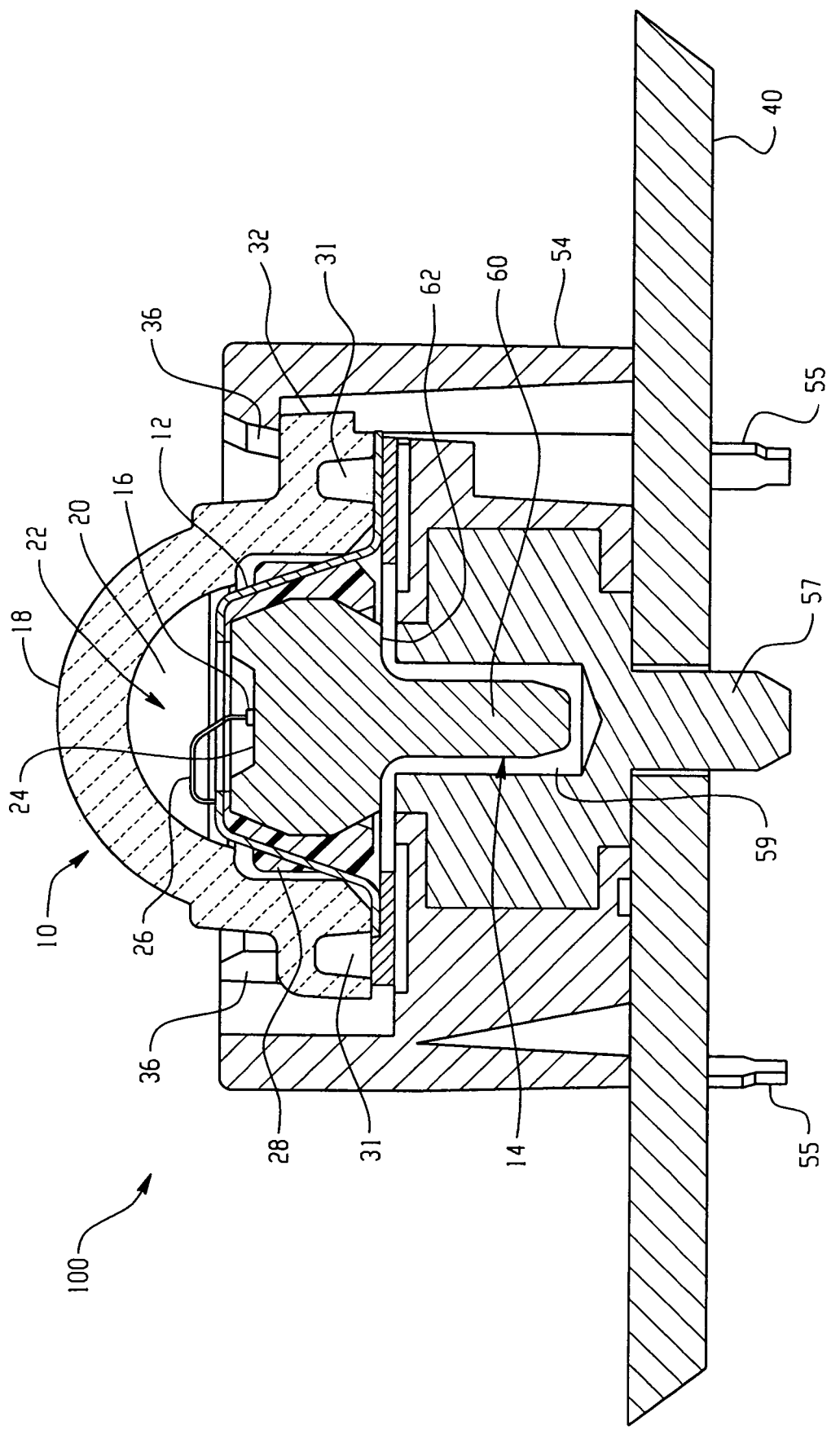
FIG. 2 is a cross sectional view of one embodiment of a system.
Figure 3:
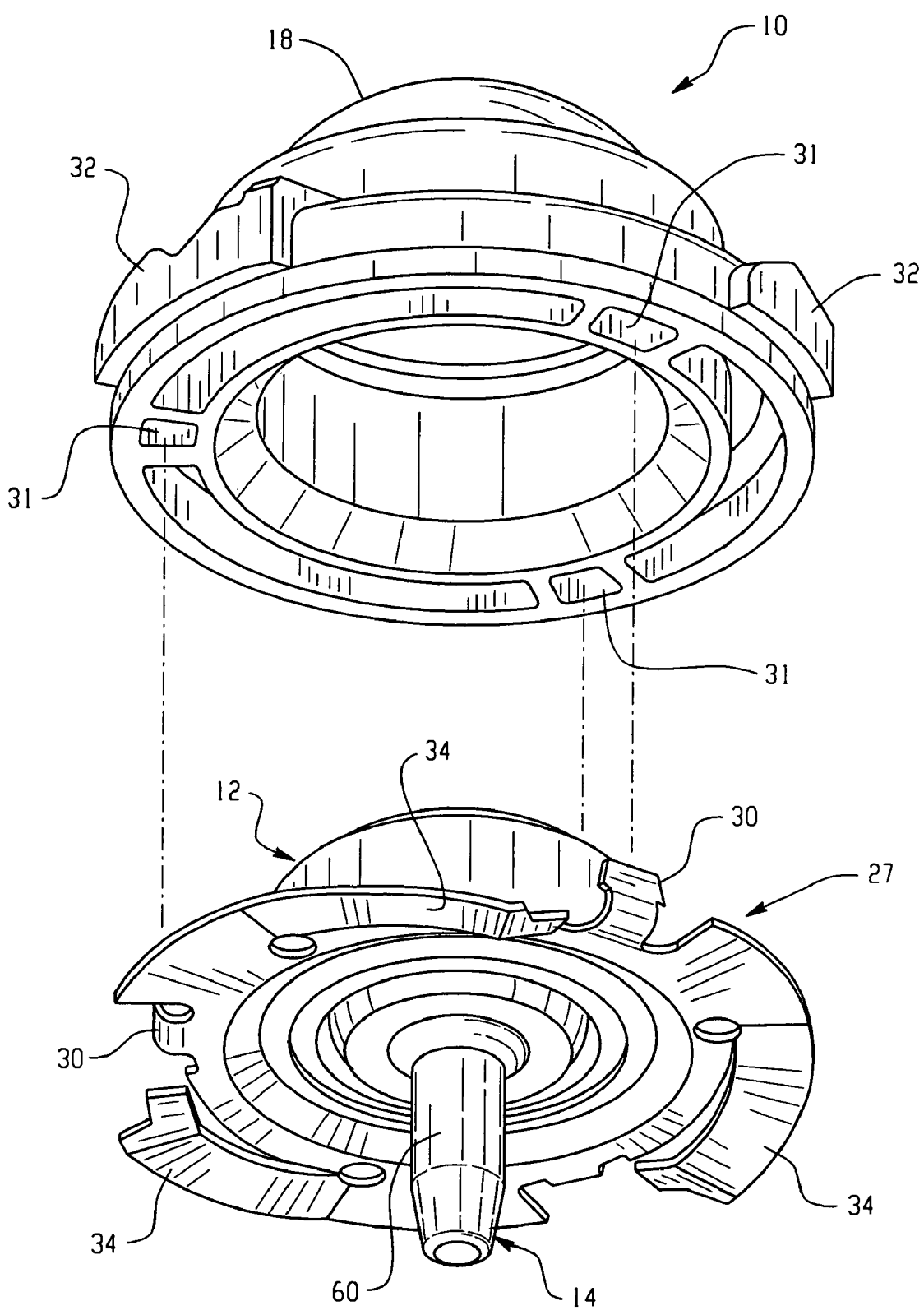
FIG. 3 is an exploded view of one embodiment of an LED package.
Figure 4:
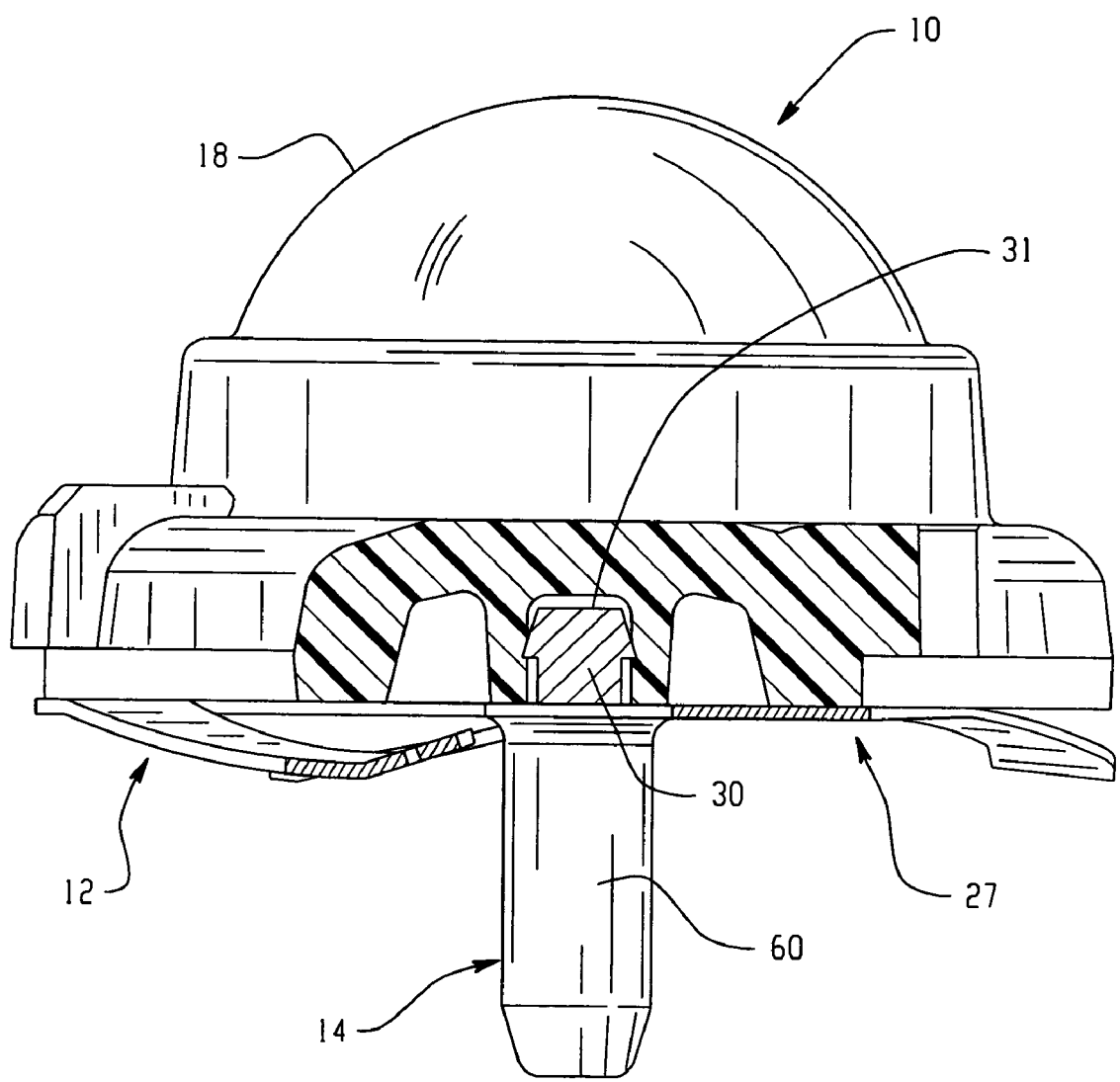
FIG. 4 is a partial cross section view of a section of one embodiment of an LED package.
Figure 5:
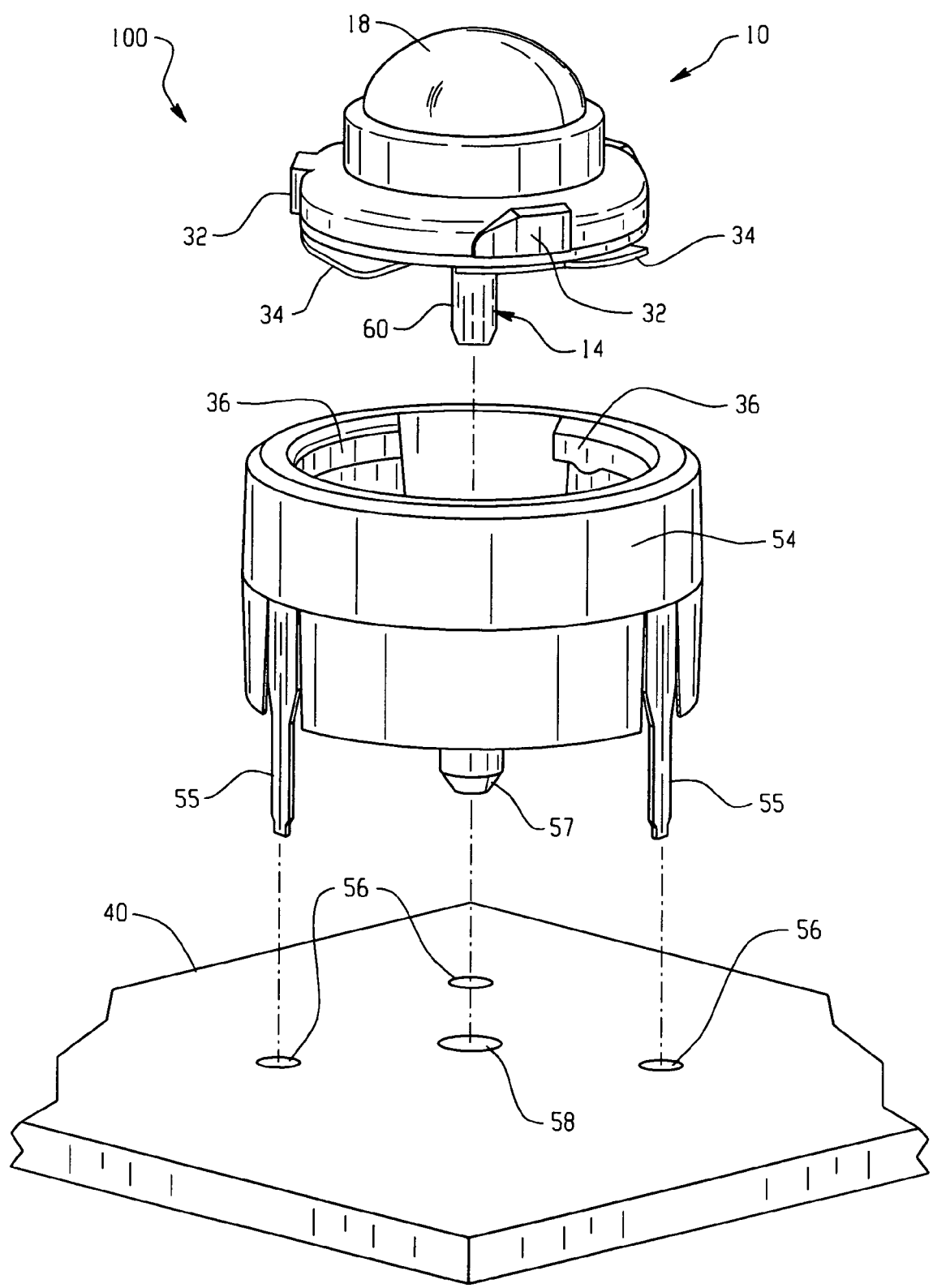
FIG. 5 is an illustration of another embodiment of a system comprising a printed circuit board, a mounting device and an LED package.

With reference to FIG. 5 and continued reference to FIGS. 1–3, a system 100 is illustrated according to an embodiment of the present invention. The lens 18 of the LED package 10 further comprises protrusions 32, which may be lens "feet," that allow the LED package 10 to be removeably secured in a coupling device 36 of a mounting device 54 in a socket-like fashion, wherein the feet 32 are biased against the coupling device 36 via flexible extensions 34 extending from a peripheral portion of the annular contact 12. The flexible extensions 34 may also serve as contacts to electrically couple the annular contact 12 to corresponding contacts in the mounting device 54, or to corresponding lands on a printed circuit board ("PCB") 40. The mounting device 54 extensions 55 extending from the mounting device 54 are received in openings 56 in PCB 40 and extension 57 extending from the mounting device 54 is received in opening 58 in the PCB 40 to couple the mounting device 54 to the PCB 40. Within the mounting device 54, an opening 59 (not shown) receives the base contact post 60. The opening 59 may have a corresponding contact to detachably couple to the base contact post 60 to complete the electrical connection to the LED package 10.

Figure 6:
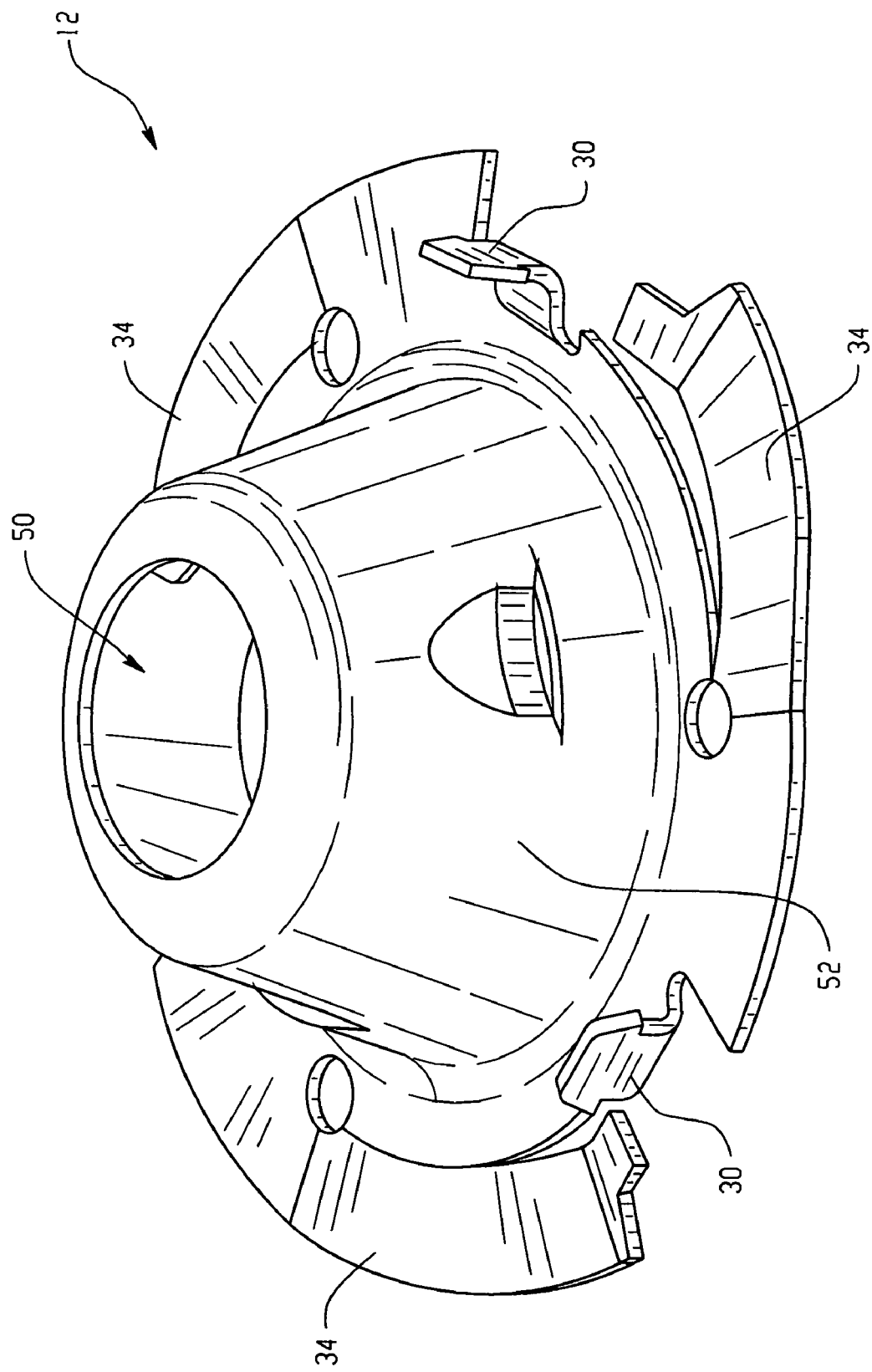
FIG. 6 is a perspective view of an annular contact according to several embodiments.

The annular contact 12 forms a portion of the leadframe 27 for the LED package 10 and is further designed to provide a large surface area for sinking heat generated during use. The shape has the still further benefit of reducing thermal expansion due to hoop stresses inherent with the annular geometry. As best seen in FIG. 6 in combination with FIG. 1, in the circular embodiment shown the annular contact 12 somewhat resembles an inverted pie pan having a centralized, preferably concentric window 50 formed in the "bottom" 52 providing access to the LED die 16 and wire bonding 26, and through which light emitted from the LED die 16 is distributed to the lens 18. However, other embodiments contemplate other generally symmetrical shapes, which are equally well suited as leadframe portions, as is the annular embodiment. As discussed above, in one embodiment of the present invention the stamped barbs 30 are formed about the periphery of a body of the annular contact 12 for captive engagement between the annular contact and the receiving openings 31 of the lens 18 during assembly of the LED package 10.

Figure 7:
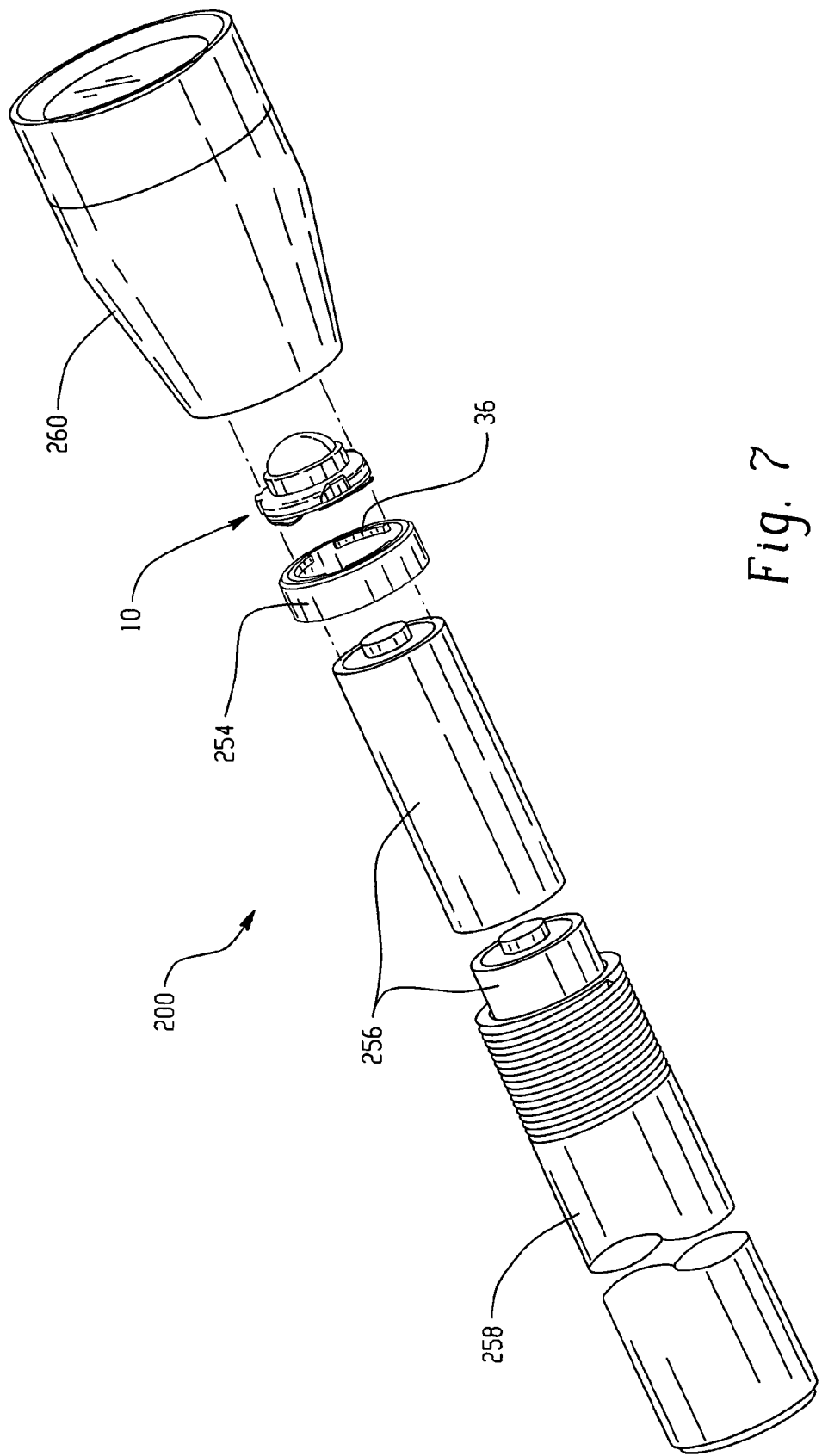
FIG. 7 is an illustration of an embodiment of the system comprising a housing and an LED package.
Figure 8:
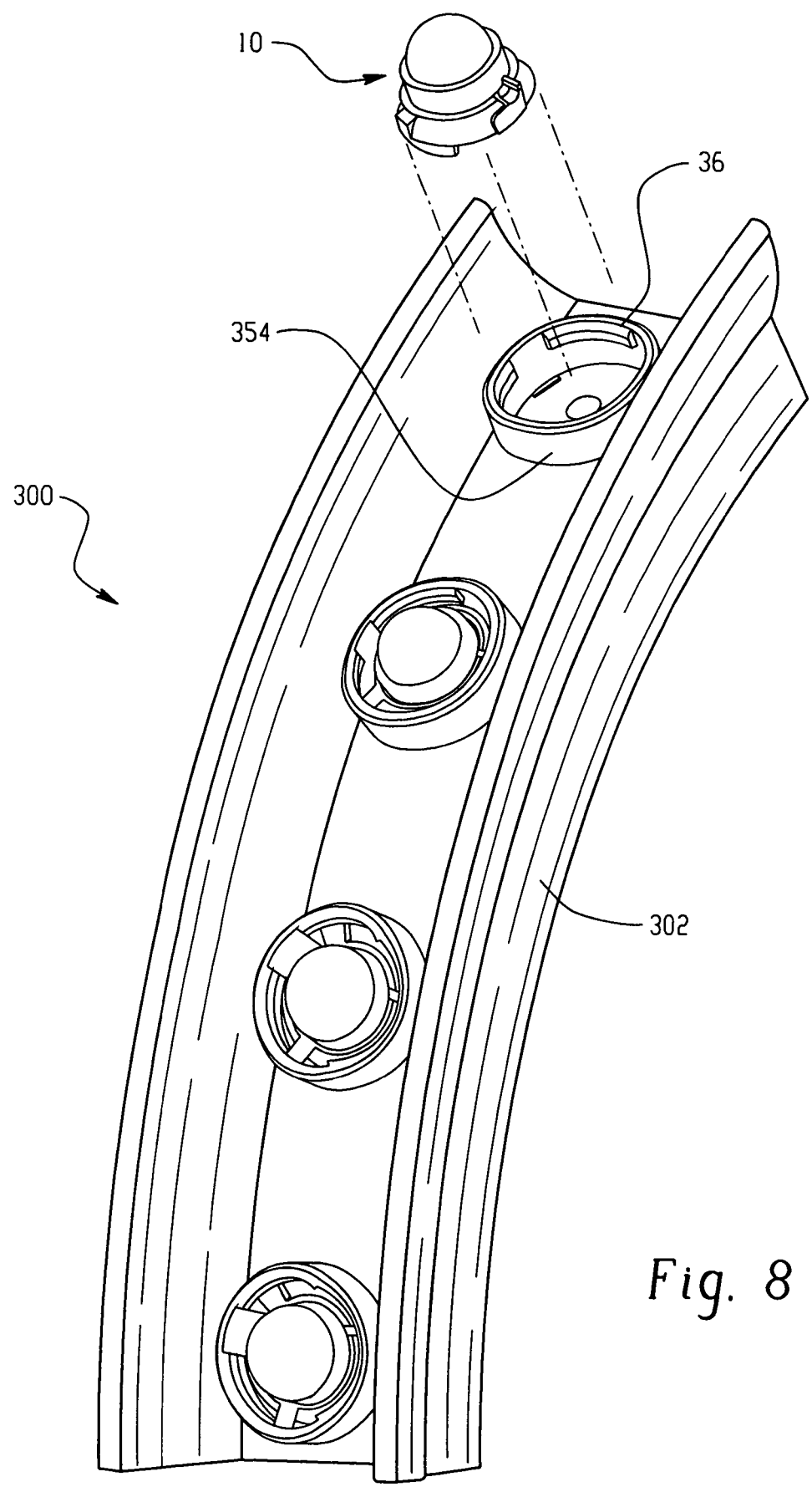
FIG. 8 is an illustration of another embodiment of the system comprising a carrier array and LED packages.

The LED package 10 also allows for significant improvement in the assembly process for products that use LEDs. Since the LED package 10 is not orientation-specific, it may be mounted in the mounting device 54 on the PCB 40 as shown in FIGS. 2 and 5, or as seen in FIG. 7 the LED package 10 may be mounted in a mounting device 254 in a light illumination device 200. Likewise, as shown in FIG. 8 the LED package 10 may be mounted in a mounting device 354 in an light fixture assembly 300, where in any of these embodiments the LED package 10 is mounted in any orientation, radially about its center. This eliminates the need for specific component orientation prior to assembly. The embodiments shown in FIGS. 1–5 and 7–8 may resemble a plug that allows the LED package 10 to be easily installed into the coupling device 36 of the mounting device 54,254,354 in a socket-like fashion without the need for heat or tools, and secured by rotating the LED package 10 until the protrusions 32 are fully engaged with the coupling devices 36.

Figure 9:
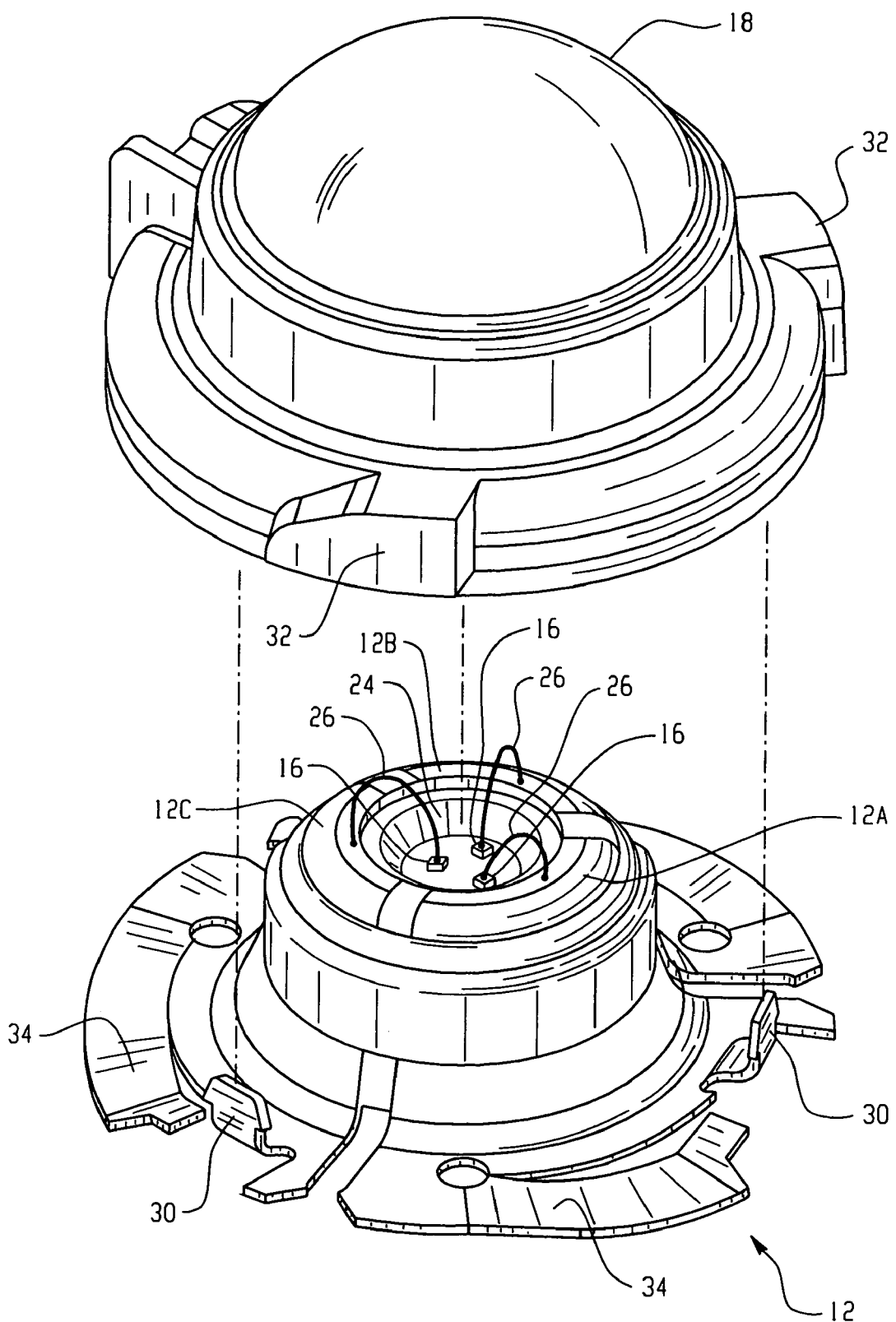
FIG. 9 is an exploded view of another embodiment of an LED package with plural LED dice.
Figure 10:
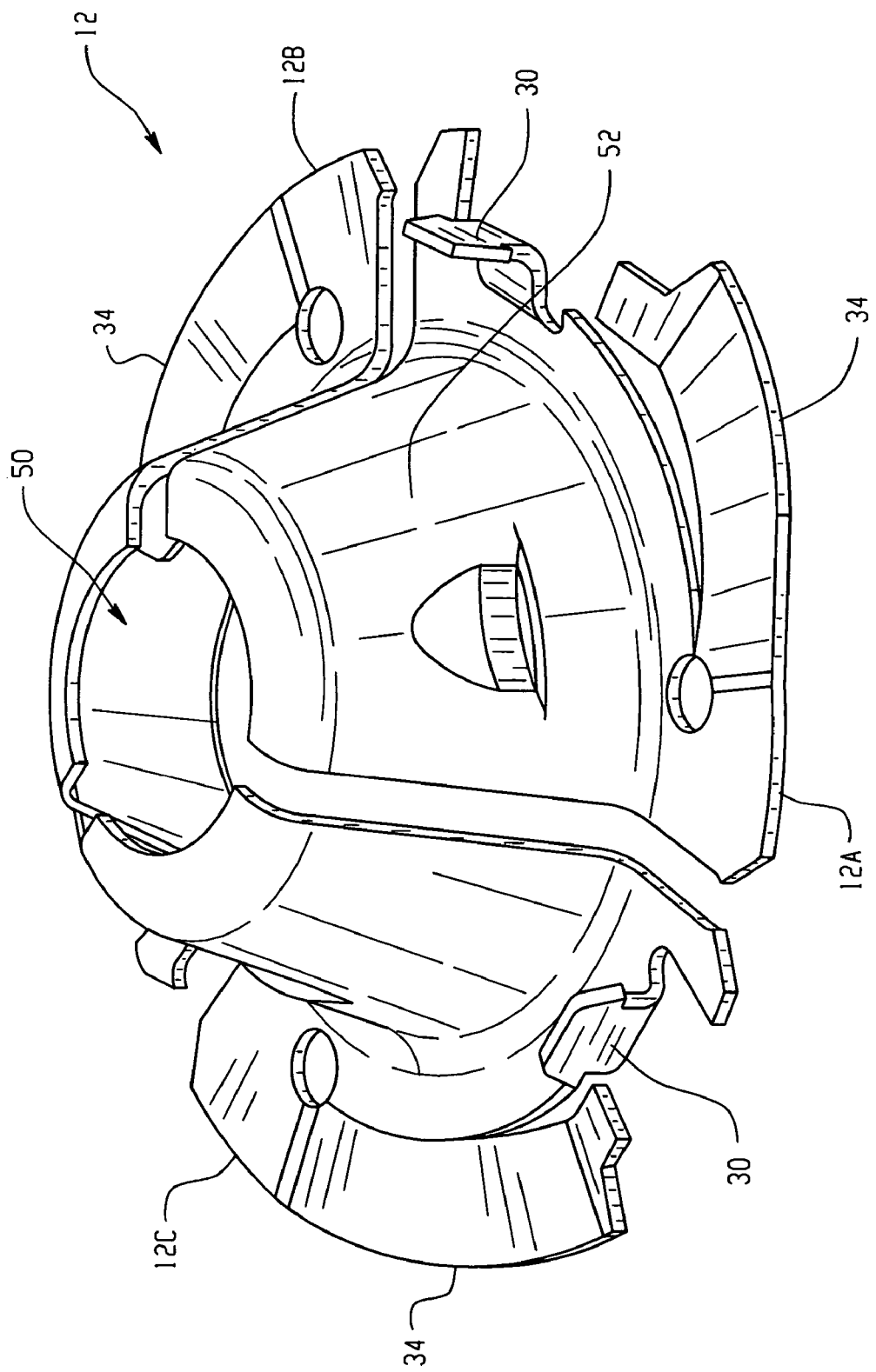
FIG. 10 is a perspective view of a segmented annular contact according to several embodiments.

Other embodiments of the LED package 10 utilize multiple LED dice 16, such as the embodiments shown in FIG. 9. The dice 16 may be any desired combination of LED colors, such as red, green and blue. In some of these embodiments, each of the LED dice 16 may be coupled via wire bonding 26 to different segments of the annular contact 12 to provide two or more separate annular contact segments for each LED die 16. An example annular contact 12 having three segments 12A–C is shown in FIGS. 9 and 10. The annular contact also has a centralized, preferably concentric window 50 formed in the "bottom" 52 providing access to the LED die 16 and wire bonding 26, and through which light emitted from the LED die 16 is distributed to the lens 18. As with other embodiments of the present invention, the segmented annular contact 12 may include flexible extensions 34 and complementary coupling devices 30. With the annular configuration of the embodiments, multiple wire bondings 26 from the annular contact 12 to the multiple LED dice 16 can be easily accommodated. Annular contact segments 12A–C may be electrically isolated to facilitate individual illumination of LED dice 16. Alternatively, the annular contact segments 12A–C may be electrically interconnected to simultaneously illuminate the LED dice 16. Electrical power may be coupled to multiple LED dice 16 by connecting the N-type material portions or contacts of the dice to the base contact 14 to form a first electrical connection to a power source. Alternatively, the P-type material contact of the dice 16 may be connected to the base contact 14. The remaining contacts of the dice 16 are then individually connected to particular annular contact segments 12A–C.

Figure 11:
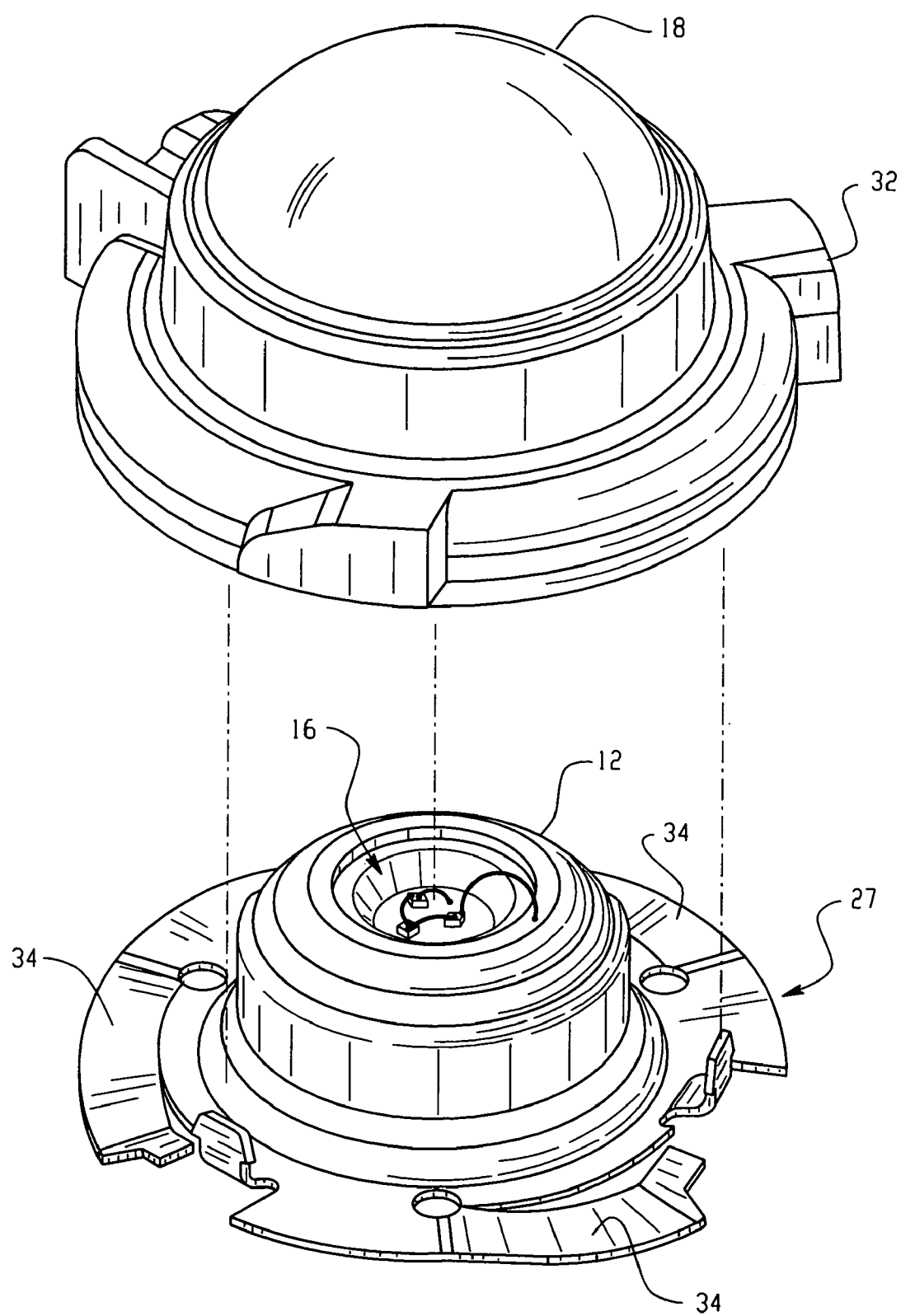
FIG. 11 is an exploded view of another embodiment of an LED package with plural LED dice connected in series.
Figure 12:
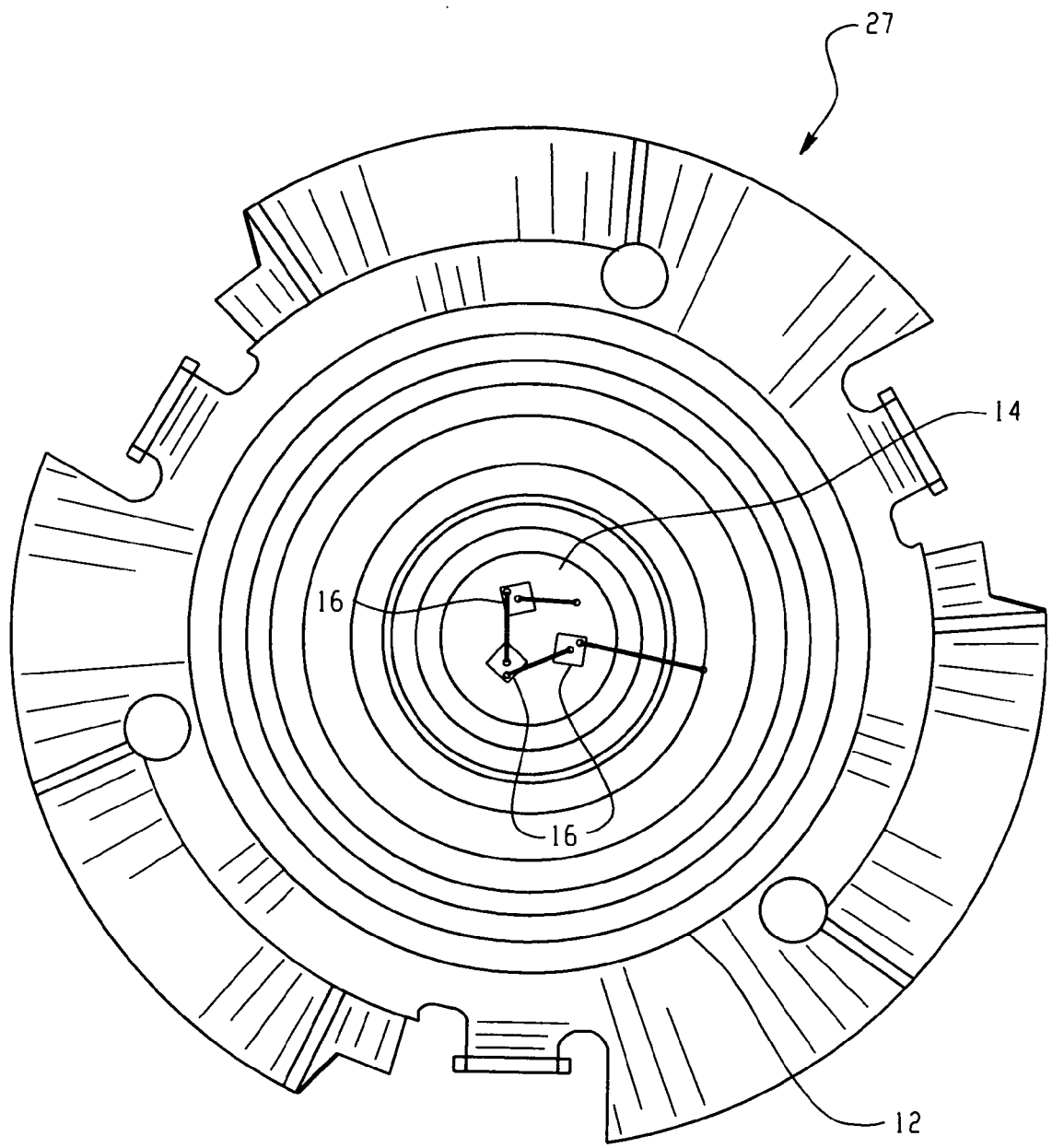
FIG. 12 is a plan view of a leadframe with plural LED dice connected in series according to an embodiment of the present invention.

In still another embodiment of the present invention, two or more LED dice 16 may be electrically insulated from the base contact 14 and electrically interconnected in series fashion, as illustrated in FIGS. 11 and 12 such that the N-type contact of a first LED die 16 is connected to a P-type contact of a second LED die with a wire bond. Additional LED dice 16 may be connected in the series string in a like manner. The P-type contact of the first LED die 16 is connected to the annular contact 12 with a wire bond while the N-type contact of the last LED die in the series is connected to the base contact 14. Alternatively, the P-type contact of the first LED die 16 may be connected to the base contact and the N-type contact of the last LED die in the series may be connected to the annular contact 12 with a wire bond. In yet another embodiment of the present invention, the P-type and N-type contacts may be located on the top surface of the die 16 to facilitate the wire bonding connections.

Figure 14A:
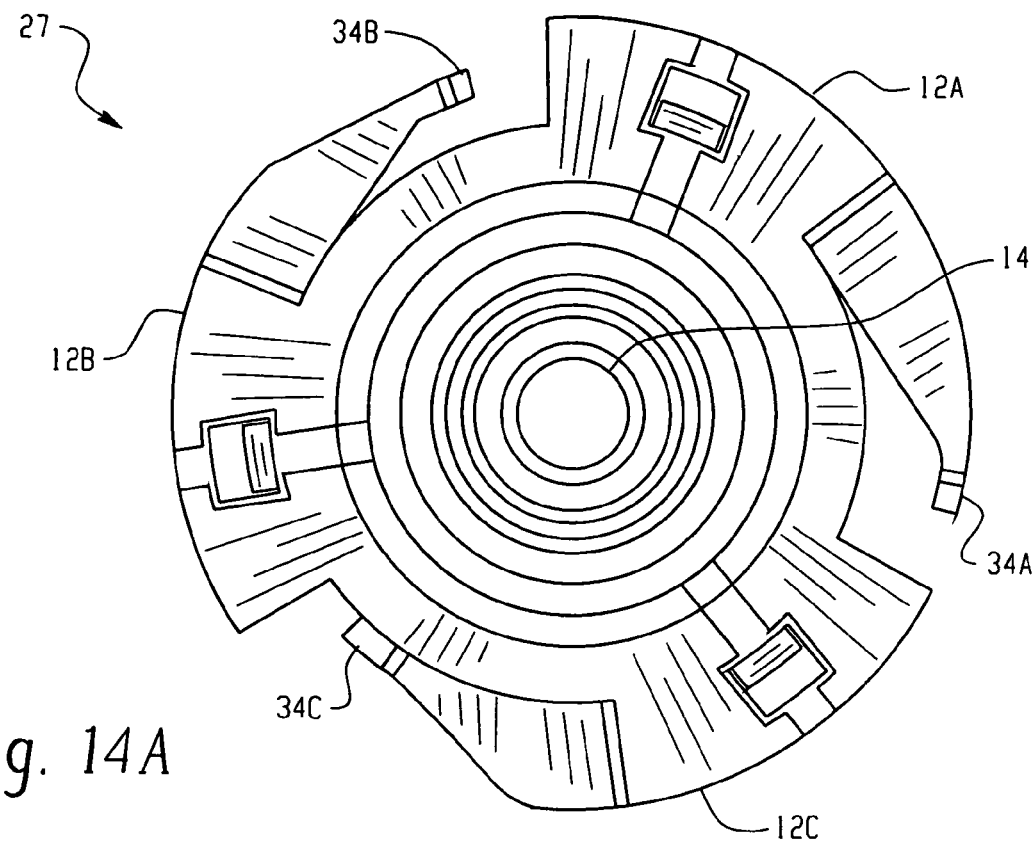
FIG. 14A is a plan view of an LED package showing an alternate embodiment of the flexible extensions and base contact for connecting electrical power.
Figure 14B:
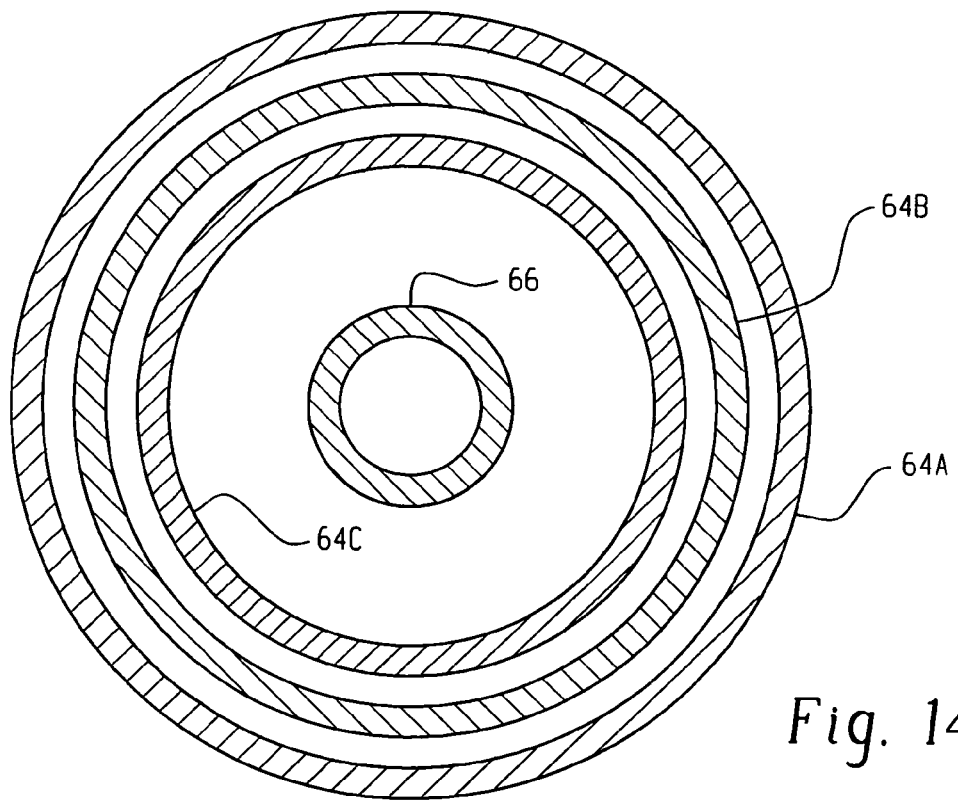
FIG. 14B is a plan view of electrical contacts on a PCB or a mounting device that correspond to the flexible extensions and base contact of FIG. 14A according to an embodiment of the present invention.

The flexible extensions 34 may be used to complete the electrical connection to a power source, as previously described. At least one flexible extension 34 may be connected to each LED die 16. The flexible extensions 34A–C may be configured to orient with corresponding contacts 64A–C on a PCB 40 or a mounting device 54 to facilitate individual coupling to the LED dice 16 via annular contact segments 12A–C, as shown in FIGS. 13A–B. The orientation of the flexible extensions 34 and corresponding contacts 64 may or may not be indexed. Similarly, the base contact 14 may couple to a corresponding contact 66 to complete the electrical circuit. Alternatively, the flexible extensions 34A–C may each have a differing diametrical pitch as shown in FIG. 14A to permit individual electrical coupling to corresponding contacts 64A–C, as shown in FIG. 14B, allowing individual electrical coupling to the LED dice 16 connected to annular contact segments 12A–C. The base contact 14 couples with a corresponding contact 66 to complete the electrical circuit.

In an alternate embodiment of the present invention, the leadframe 27 may be laser welded, rather than soldered, or otherwise mechanically coupled to the PCB 40 to provide electrical contact between the LED package 10 and the PCB 40, thereby minimizing the risk of overheating the LED die 16 during assembly of the LED package 10 into a product or subassembly. In yet another embodiment, the leadframe 27 may be laser welded to a contact arrangement to eliminate the need for a PCB 40.

Referring again to FIGS. 1–4, the LED package 10 utilizes a lens 18, which may be premolded and may be constructed of any one of a number of known materials, such as epoxy resin, urea resin, silicon resin, acrylic resin, glass, or the like, in various lens patterns or geometries. As used herein, "pattern" refers generally to the shape of an output beam of light emitted by LED package 10. Likewise, "geometry" refers to the physical shape of lens 18 such as, without limitation, texturing and/or faceting of the lens. While shown in a circular embodiment, the geometry of the lens 18 may be any generally symmetrical shape such as, without limitation, square, hexagonal, triangular and the like. The lens 18 provides the optical pattern for the LED package 10, and may be configured as a convex, concave, or collimating lens and may be optically clear or contain dispersants to diffuse the emitted light. In several embodiments, the inside surface of the lens 18 may be coated with a suitable light excitable material or the lens 18 may comprise a suitable light excitable material, which may be a phosphor material, for generating white light when excited with a blue, ultraviolet, or other color LED die 16. In other embodiments, the optical material 20 may comprise the light excitable material. In addition, the lens 18 both partially defines the cavity 22 for the optical material 20 and acts as a protective shield for the LED die 16 and attendant wire bonding 26. By premolding the lens 18, the optical output of the LED package 10 is easily modified by producing a different configuration, pattern, or geometry of the lens 18.

The LED die 16, which may have an index of refraction "n" of about 3.40, provides light output. The LED die 16 design and its method of manufacture are described in by Shimizu and others. The LED die 16 may be a multi-layer epitaxial semiconductor structure comprising an N-type material portion and a P-type material portion wherein the P-type material portion is electrically connected to an annular contact 12 and the N-type material portion is electrically connected to a base contact 14. Alternatively the N-type material portion may be electrically connected to the annular contact 12 and the P-type material portion may be electrically connected to the base contact 14. When electrically energized, the LED die 16 emits light of a wavelength predetermined by its chemical makeup. As discussed above, to produce the desirable white LED output, multiple colors of LED dice 16, such as red, blue and green, may be combined into a single LED package, as previously discussed and seen in FIGS. 9, 11 and 12. However, in other embodiments a blue, ultraviolet, or other color LED die 16 is used to excite a phosphor containing component in the lens 18 or in optical material 20 in order to produce a white light. Some prior art devices that have similar functions are Singer et al. that teaches the use of a phosphor layer on top of a blue LED die to produce a white LED, Shimizu et al. that teaches the use of phosphor materials embedded into a resin coating material place over the LED die, and Shimizu et al. that teaches the use of phosphor materials in the molded lens surrounding the LED die.

The optical material 20 may be an optical quality gel or grease or other soft optical material, which may have a refractive index "n" of about 1.70 or greater. The optical material 20 is contained in the lens 18 to possibly provide gradual transition of index of refraction between the LED die 16, which may have an index of refraction "n" of about 3.40, and the lens 18, which may have an index of refraction "n" of about 1.5. If the optical material 20 is an optical gel it may be of a type manufactured, for example, by Nye Optical. In addition, the soft optical material 20 reduces the stress on the wire bond 26 and LED die 16 caused by thermal expansion of the LED components. In one embodiment, the optical material 20 is formed so that it has varying indexes of refraction by arranging it in layers within the lens 18, where the layer having the highest index of refraction is closest to the LED die 16. In addition to facilitating assembly of the LED package 10, the varying layers of optical material 20 between the LED die 16 and the lens 18 also lessens the Fresnel losses within the LED package 10.

As previously discussed, in some embodiments a white emitted light is produced using a blue, ultraviolet, or other color LED die 16 by exciting light excitable materials, which may be fluorescent materials, that may be located in or on the lens 18, or similar to what is disclosed in Shimizu et al. in U.S. Pat. Nos. 5,998,925 and 6,069,440, the optical material 20 may contain a suitable phosphor material. However, unlike the Shimizu et al. patents, in some embodiments one or more layers of the optical material 20 replaces the prior art cured epoxy coating resin. In addition, in other embodiments, rather than being confined to the cavity 22 holding the LED die 16, the phosphor bearing optical material 20 fills the entire cavity 22, which is more effective for converting more of the excitation output into white light. In the circular embodiment of the lens 18 shown in the figures, the semispherical configuration of the phosphor bearing optical material 20 also provides more of an omnidirectional output than the LEDs generally depicted by Shimizu et al.

The wire bonding 26 used to connect the annular contact 12 to the LED die 16 may be gold, but may also be made from copper, platinum, aluminum or alloys thereof. The diameter of the wire bonding 26 is typically in the area from 10–45 µm. As recognized in the art, because of thermal expansion coefficients between materials in LEDs made according to the prior art methods, wire bonds with diameters less than 25 µm are not recommended because of breakage at the bonding point. Accordingly, unlike the prior art, the wire bonding 26 is encapsulated in a soft optical material rather than a hard resin, thus permitting some expansion without loss of the electrical bonding. The wire bonding 26 is connected to the N-type material portion or P-type material portion of the LED die 16 and the annular contact 12 by conventional wire bonding techniques.

The base contact 14, which may be a copper slug or a heat sink, is provided at the center of the LED package 10 and serves as an electrical connection for the LED package 10. As discussed above, the base contact 14 is configured to have the die cup 24 at its uppermost surface, within which the LED die 16 is mounted. As also discussed above, the liquid crystal polymer 28 may be used to couple the base contact 14 into place within the annular contact 12 to form the leadframe 27. The liquid crystal polymer 28 also provides a barrier to seal the optical material 20 in place. In addition, because the liquid crystal polymer 28 is thermally coupled to the annular contact 12 it provides for additional heat sinking for the LED die 16. The inner surface of the die cup 24 may be finished with a reflective surface, via plating, polishing or other means, in order to direct the light emitted from the LED die 16 in a predetermined manner. The mass of the base contact 14 provides superior heat sinking for the LED die 16 to allow higher power to be applied to the LED die 16, resulting in higher lumen output.

Figure 15A:
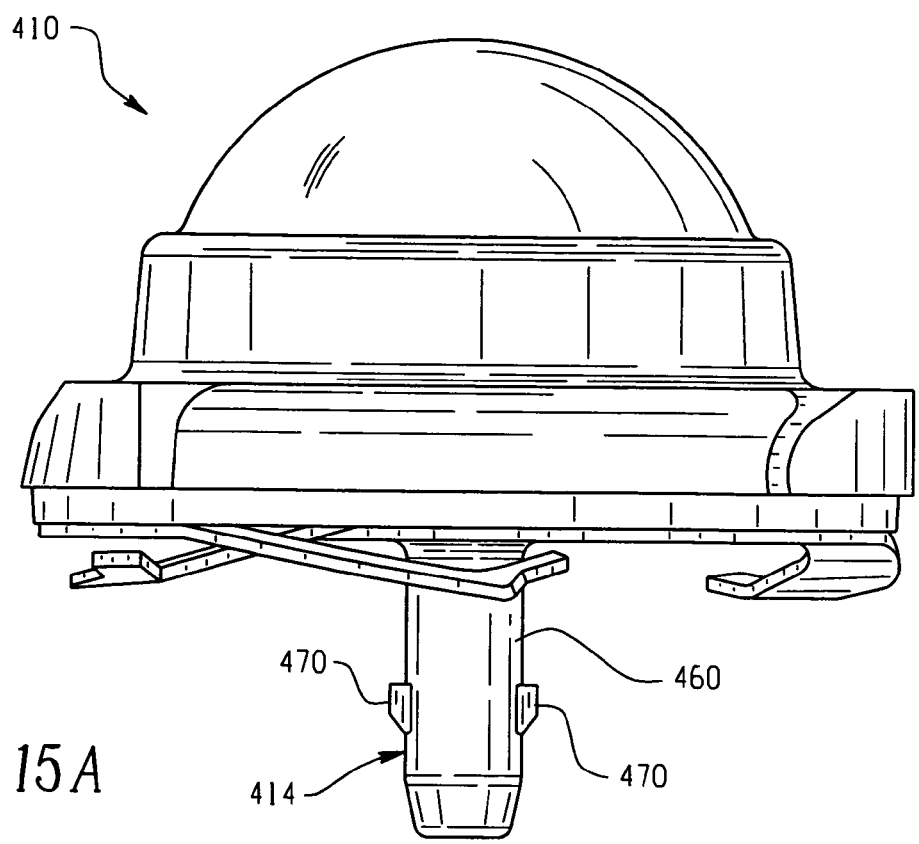
FIG. 15A is a side elevation of another embodiment of an LED package.
Figure 15B:
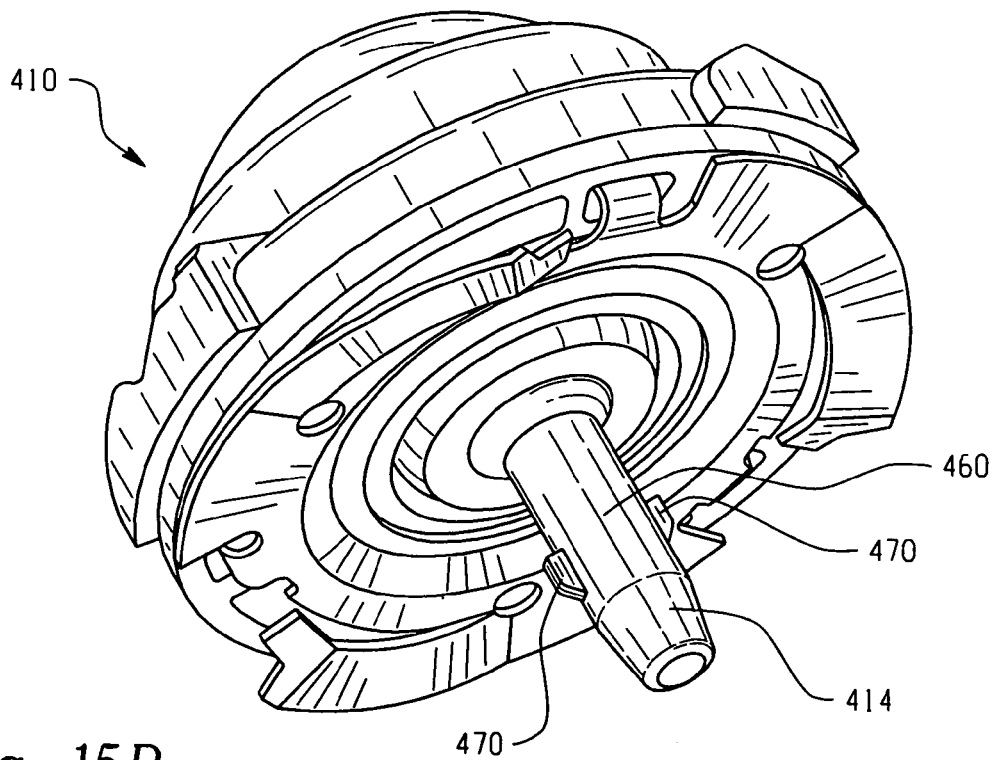
FIG. 15B is a bottom view of the LED package of FIG. 15A according to an embodiment of the present invention.
Figure 16A:
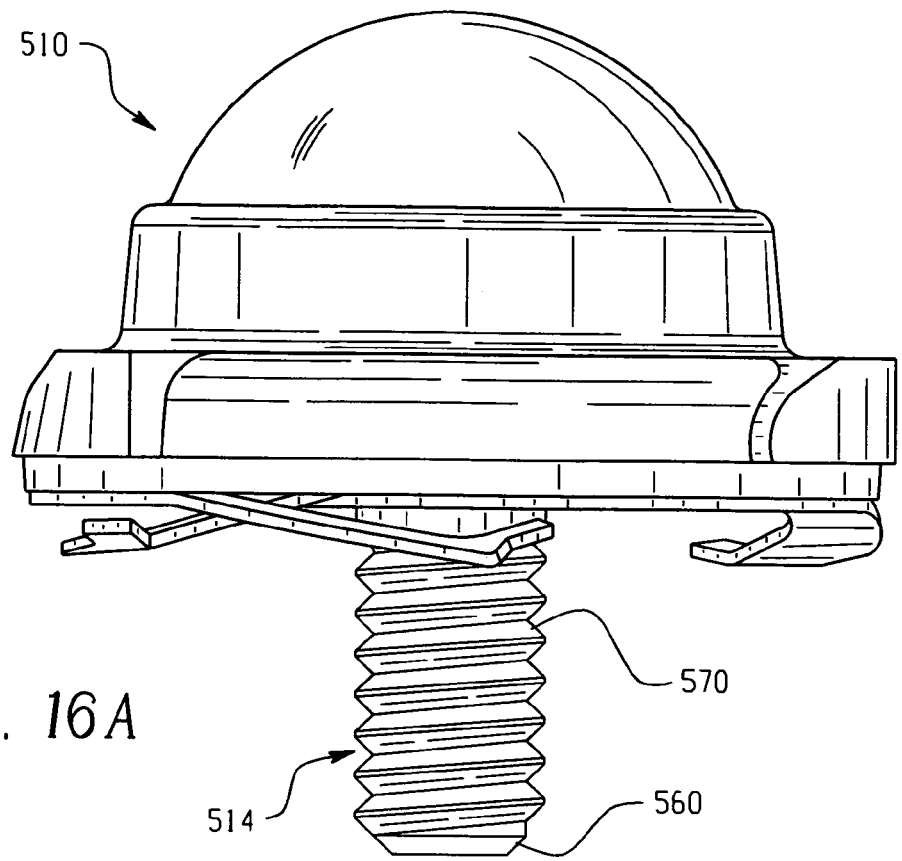
FIG. 16A is a side elevation of another embodiment of an LED package.
Figure 16B:
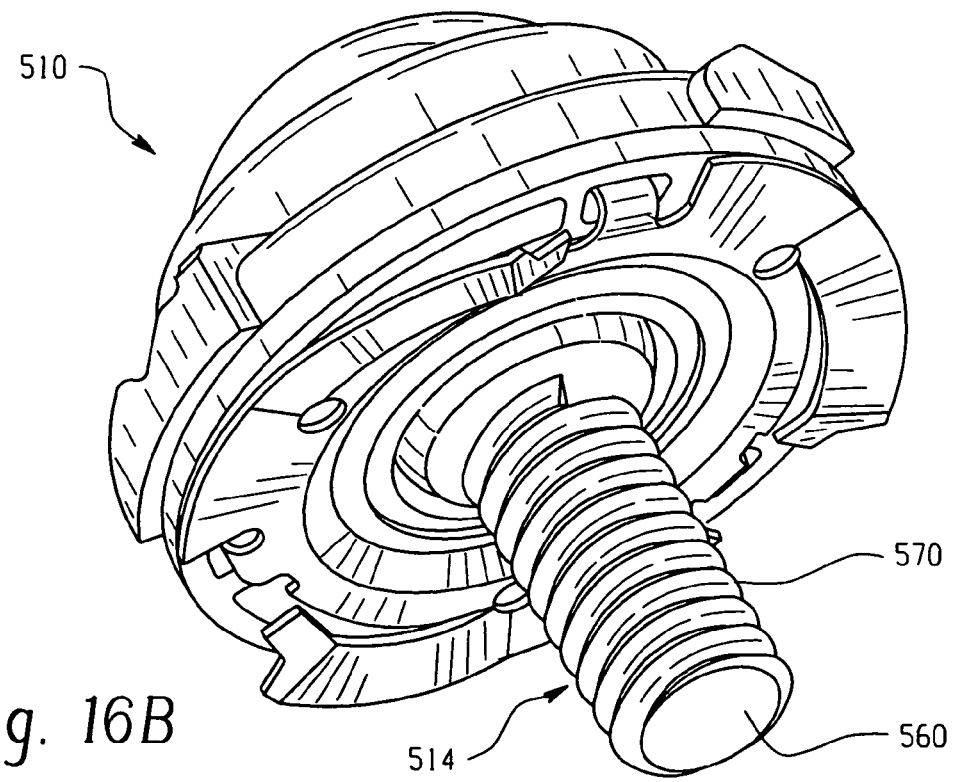
FIG. 16B is a bottom view of the LED package of FIG. 16A according to an embodiment of the present invention.

In some embodiments, the base contact 14 may be provided with an integral center post 60, as best illustrated in FIGS. 1–5. When so configured, the LED package 10 can be assembled into a PCB 40 assembly by normal soldering techniques or, without the use of heat, by fitting the LED package 10 into a complementary socket arrangement of mounting devices 32 and 36. In other embodiments when there is no integral center post, a lower base portion 62 of the base contact 14 can be laser welded or otherwise mechanically coupled to the PCB 40 or mounting device 54 to provide an electrical connection. In other embodiments, as seen in FIGS. 15A–B, an LED package 410 comprises a base contact 414 with a post 460 that comprises protrusions 470 that may be coupled to a complementary coupling device, which may be a bayonet-type coupling device. In other embodiments, as seen in FIGS. 16A–B, an LED package 510 comprises a base contact 514 with a post 560 having a threaded outer surface 570, which may be coupled to a complementary coupling device. The threaded outer surface 570 may serve to mechanically and/or electrically couple the LED package 510 to the complementary coupling device (not shown).

Figure 17:
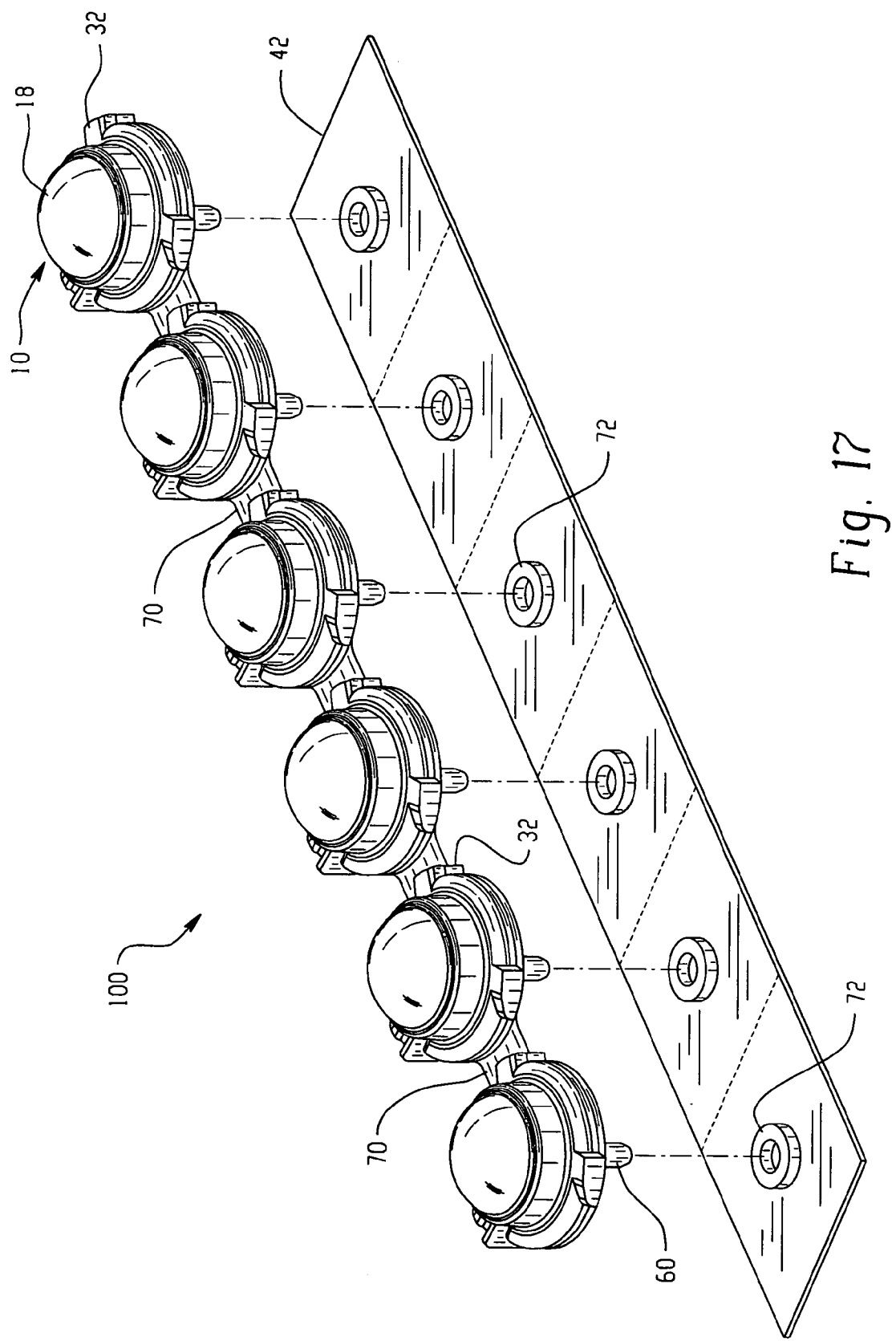
FIG. 17 is an illustration of another embodiment of a system comprising a carrier strip and LED packages.

As seen in FIG. 17, one embodiment provides an array of the annular contacts 12 that is formed continuously into the carrier strip 70, which may be an annular contact carrier strip, such as by stamping or other conventional means. This configuration facilitates manufacturing of the LED package 10. The anode carrier strip 70 also provides for alternate means of packaging the LED package 10 into subassemblies. For example, the carrier strip 42, which may be a base contact carrier strip, containing receiving devices 72 having a common base contact may be employed as one assembly. Each of the center posts 60 of each of the LED packages 10 may be connected to the receiving devices 72 on a carrier strip 42, where each of the annular contacts 12 may be connected using a carrier strip 70. In such an application, only one electrical connection to the base contact via the carrier strip 42 would be necessary. Likewise, the annular contact carrier strip 70 can be configured to have a common electrical connection, in which case an entire strip of the LED packages 10 can be easily assembled by making only two electrical connections. The base contact carrier strip 42 and the anode carrier strip 70 may be periodically scored (shown as dashed lines) along their length to enable the base contact carrier strip 42 and the annular contact carrier strip 70 to be in broken into predetermined lengths.

The LED package 10 may be incorporated directly into products to eliminate the need for secondary coupling devices and printed circuit boards. FIG. 7 illustrates a portable lighting illumination device 200, such as a flashlight. The LED package 10 is mounted into a mounting device 254. The mounting device 254 serves to mechanically secure the LED package 10 within the flashlight 200, and also facilitates electrical connections between the LED package 10 and the batteries 256. A housing 258 and lighthead 260 provide a secure package for the flashlight components.

Likewise, the LED package 10 may be directly incorporated to a light fixture 300, as shown in FIG. 8. A housing structure 302 holds one or more mounting devices 354. The mounting devices 354 mechanically secure the LED packages 10 to the housing structure 302 and also facilitate electrical connections to the LED package. The light fixture 300 may be any type of interior or exterior, fixed or portable light. Examples include, but are not limited to, position lights, reading lights, indicators, night lights, backlights, and marker lights. Additional examples may include automotive signaling devices such as stop lights, brake lights, taillights indicator lights, turn signals and hazard lights.

Additional embodiments of the present invention are shown in FIGS. 18–21. In these embodiments an LED package 610 includes a generally radial leadframe 612 having a base contact 614, an annular contact 616 and an insulating member 618. Certain embodiments of LED package 610 may further include a trim bezel 620 and an optical material 622.

Figure 18:
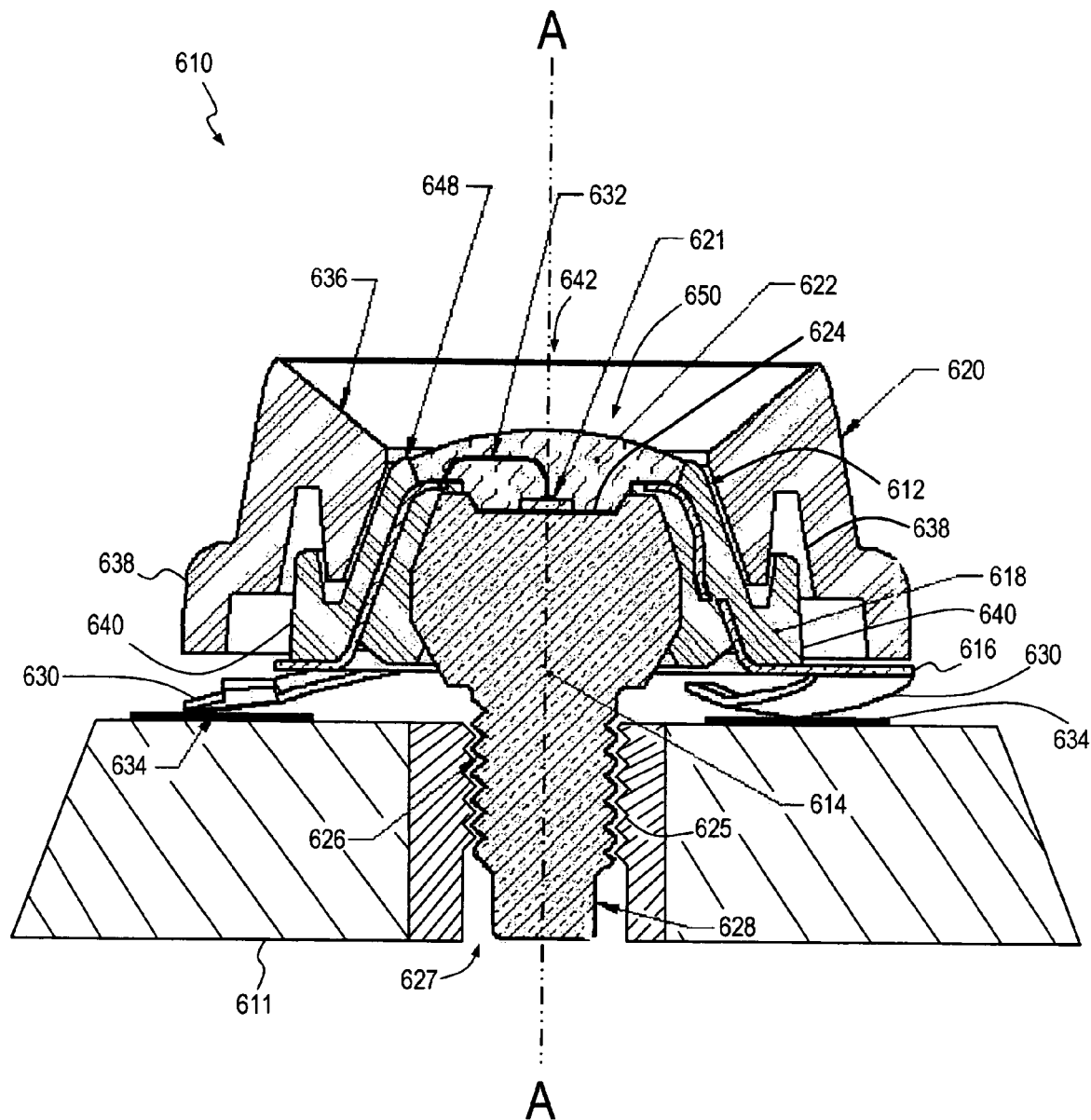
FIG. 18 is a view in section of an LED package according to another embodiment of the present invention.

With particular reference to FIG. 18, base contact 614 provides a thermal path to conduct heat away from an LED die 621. In addition, base contact 614 provides a die cup 624 for mounting LED die 621. Base contact 614 and/or die cup 624 may optionally be polished, plated or finished with a reflective material, such as silver, to reflect light emitted from sides of LED die 621 and thus generally increase the light output of LED package 610 by directing more of the light emitted by the LED die out of LED package 610.

Figure 19:
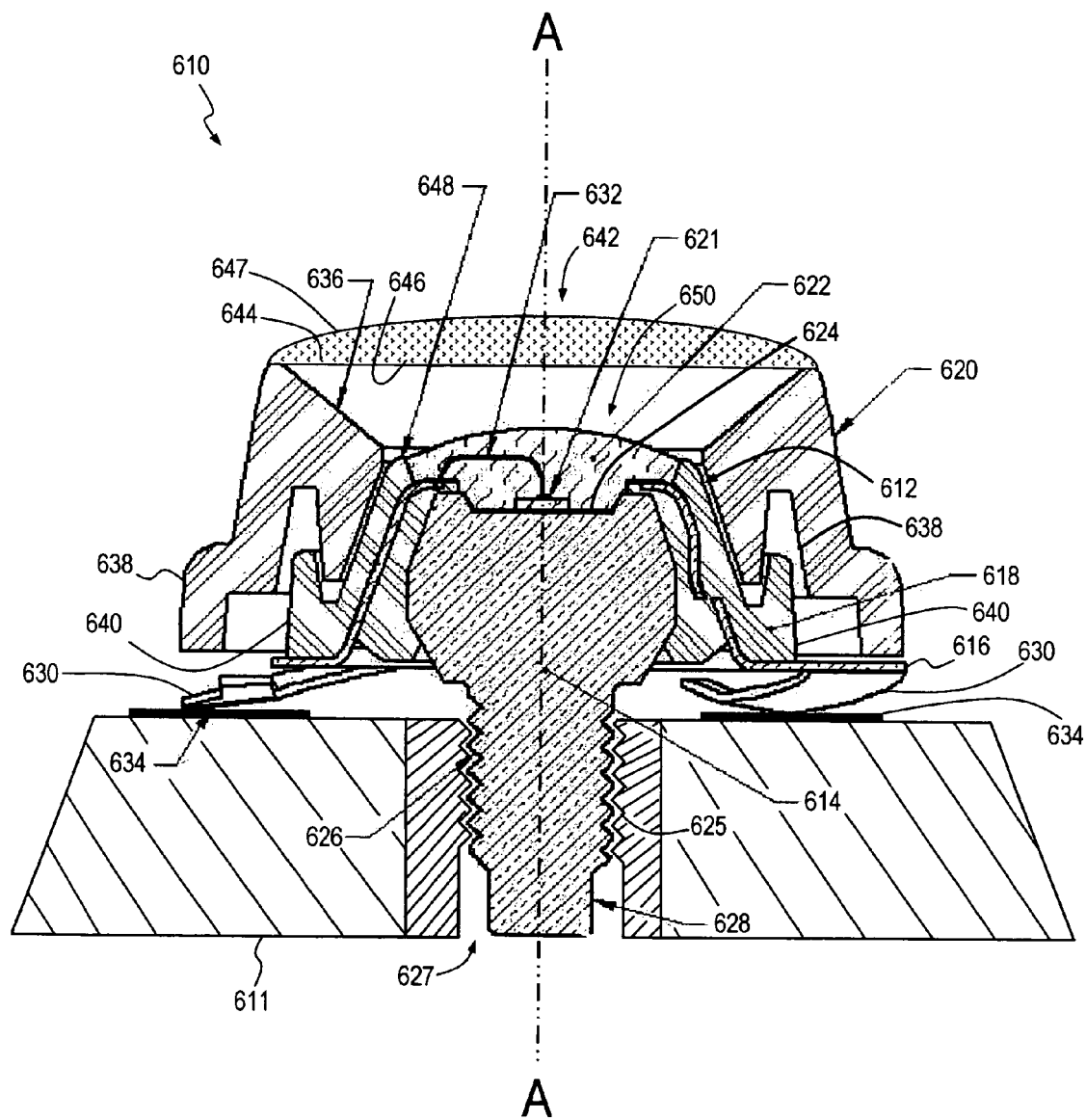
FIG. 19 is a view in section of an LED package according to yet another embodiment of the present invention.
Figure 20:
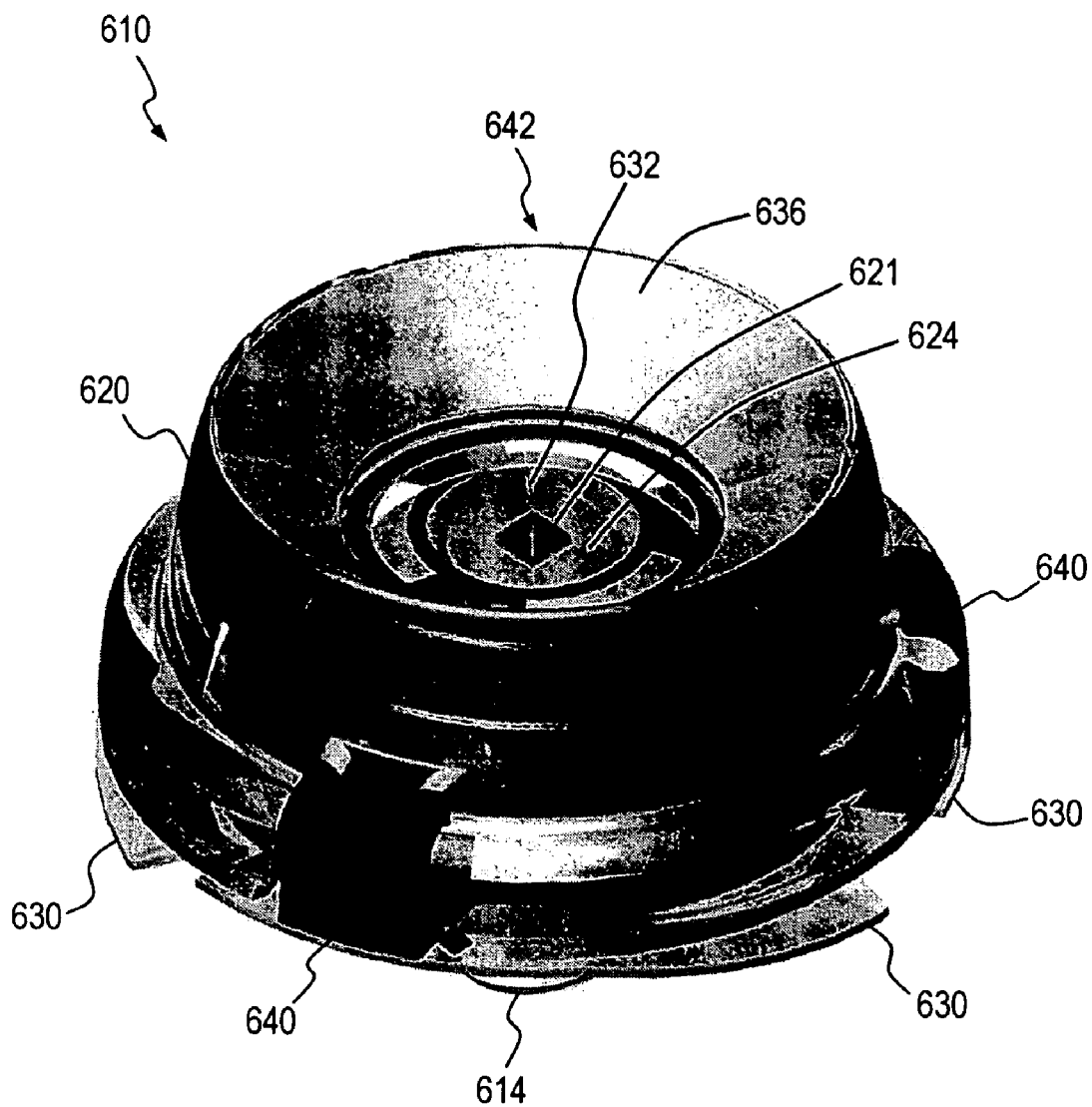
FIG. 20 is a perspective view of the LED package of FIG. 18.

Base contact 614 includes a threaded extension 626 to mechanically secure LED package 610 to a complementary coupling device 611, as shown in FIGS. 18 and 19. Threaded extension 626 further aids to remove heat generated by LED die 621 by providing a low-resistance thermal path, as the thread is in generally continuous contact with a mating thread 625 of complementary coupling device 611. Threaded extension 626 also provides an electrical connection to one of an anode and cathode of LED die 621.

Threaded extension 626 may optionally include a conventional "dog point" 628. Dog point 628 is a generally cylindrical extension or pilot, having a diameter smaller than the minor diameter of the thread of threaded extension 626. Dog point 628 may optionally include a generally conical section between it and the thread of threaded extension 626. Dog point 628 provides a self-centering pilot or guide to assist in the insertion of LED package 610 into complementary coupling device 611 and is effective to prevent cross threading of threads 626 with corresponding threads 625 of the complementary coupling device.

Base contact 614 is preferably constructed of copper or a copper alloy. Other suitable materials include aluminum, silver, gold, brass and bronze.

Annular contact 616 provides electrical connection(s) to LED die 621 and is generally radial in geometry to eliminate orientation issues with insulating member 618 and trim bezel 620 during assembly of LED package 610. Annular contact 616 is in a generally concentric or coaxial arrangement with base contact 614 about an axis "A," as shown in FIGS. 18 and 19. Annular contact 616 has the same general shape as annular contact 12 (see FIG. 6) and the details of the structure are not repeated here.

Annular contact 616 includes at least one spring contact 630 to provide an electrical connection to LED die 621 via a wire bond 632. Spring contacts 630 each exert a downward force to press against a mating contact 634 of complementary coupling device 611. This downward force is adapted to compensate for variations in the mating contact, thus ensuring sufficient electrical contact and reducing the need for expensive, high-precision or tight-tolerance manufacturing processes to be employed in the fabrication and assembly of LED package 610.

Annular contact 616 is preferably plated with a conventional wire-bondable plating material, such as silver, palladium, gold and platinum. The plated area may be limited to the region of annular contact 616 that wire bond 632 is connected, if desired. Exterior portions of annular contact 616, i.e., those portions that are exposed, are preferably plated with a corrosion-resistant material. Suitable corrosion-resistant materials include, without limitation, nickel, tin, palladium, gold and platinum.

Insulating member 618 is electrically insulative and is disposed between annular contact 616 and base contact 614. Insulating member 618 provides a mechanical connection between annular contact 616 and base contact 614. Insulating member 618 may be made from any suitable material including, without limitation, polycarbonate, acrylic and nylon.

Trim Bezel 620 provides protection for spring contacts 630 of leadframe 612. Trim bezel 620 also provides a convenient surface for grasping LED package 610 during installation and removal of the LED package with respect to complementary coupling device 611. In other embodiments, insulating member 618 of lead frame 612 may be adapted to both protect spring contacts 630 and provide a grasping surface, thus eliminating the need for trim bezel 620.

Trim bezel 620 may be molded or finished in a color generally corresponding to that of the color of emission of the LED die 621 for a particular LED package 610. The corresponding molded color allows for convenient identification of LED die 621 emission color, which may be otherwise difficult to ascertain without powering LED package 610. Trim bezel 620 may be constructed of any suitable material, including plastics, such as polycarbonate, acrylic, nylon and so on. Metals or ceramics or a combination of these materials may also be utilized.

Trim bezel 620 may optionally include a reflective surface 636 to improve light output and to shape the beam pattern of LED package 610. Reflective surface 636 may be a plated or highly polished surface. If reflective surface 636 is plated, the plating may be any specular material including, but not limited to, chrome, aluminum, silver and gold. The plating may be deposited using plasma vapor deposition ("PVD"), chemical vapor deposition ("CVD"), sputter deposition, vacuum metallization or other conventional methods. The shape of reflective surface 636 may be altered as desired to create the desired beam pattern required for a particular application. For example, reflective surface 636 may be a conical, parabolic or hyperbolic shape or a combination of these to form a complex surface. Reflective surface 636 may also be selectively deposited or polished such that the reflective surface is exposed to LED die 621.

Figure 21:
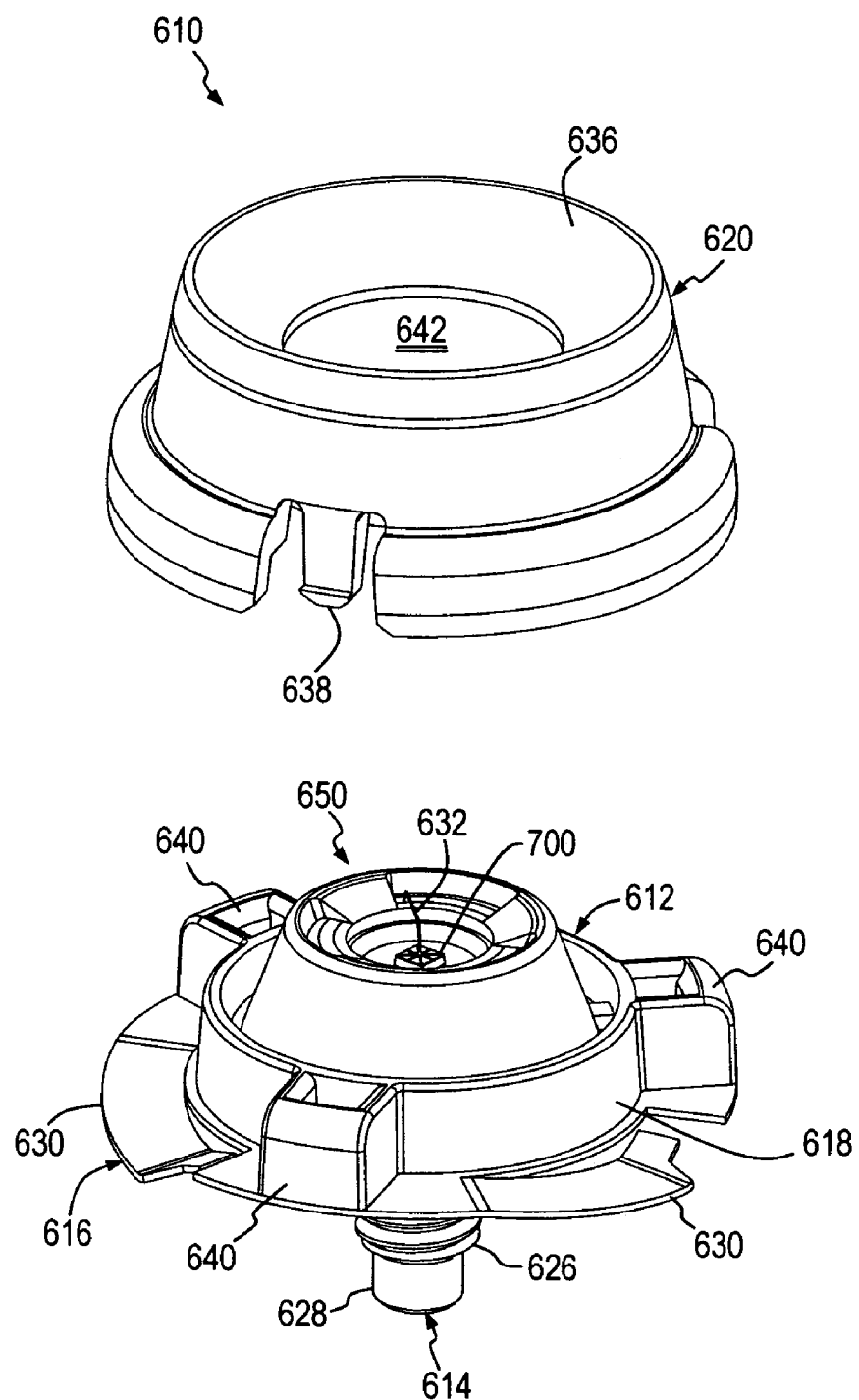
FIG. 21 is an exploded view of an LED package showing coupling of a trim bezel and a leadframe.

An exploded view of an LED package 610 is depicted in FIG. 21. In this view trim bezel 620 is separated from leadframe 612, showing details of the trim bezel and leadframe. Trim bezel 620 includes tabs 638 to mechanically engage receiving members 640 of leadframe 612 when assembling the leadframe to the trim bezel.

A central portion of trim bezel 620 includes an opening 642, allowing light emitted by LED die 621 to be radiated by LED package 610. Alternatively, an optically transmissive lens 644 may be molded as part of trim bezel 620 or constructed as a separate component and coupled to the trim bezel to cover LED die 621, as shown in FIG. 19. Lens 644 may be constructed of any suitable optical material, such as a clear plastic or glass. In an alternate embodiment of the present invention, a surface as at 646 of lens 644 may be coated with a phosphor or other photo-reactive material that may be excited by light emission from LED die 621 to emit a different wavelength or a spectrum of wavelengths of light. The combination of these wavelengths may be combined to create light having a generally white chromaticity or any other desired color, such as pink. In several embodiments, one or more surfaces 646 of lens 644 may be coated with a suitable light excitable or photo-reactive material, or the lens may be made of a substance that includes a suitable light excitable or photo-reactive material, such as a phosphor, for generating white light when excited with a blue, ultraviolet, or other color LED die 621.

Leadframe 612 is formed by coupling together insulating member 618 and annular contact 616. In a preferred embodiment, leadframe 612 is formed by placing base contact 614 proximate annular contact 616 and molding the base contact and annular contact together with insulating member 618 such that the base contact and annular contact are electrically isolated from each other. Alternate coupling methods include forming insulating member 618 separately and joining it to annular contact 616 with adhesive. Leadframe 612 further includes receiving members 640, adapted to connect to tabs 638 of trim bezel 620, to couple the leadframe to the trim bezel such that the leadframe is generally centered about base contact 614.

Leadframe 612 may additionally include a potting dam 648 to contain optical material 622, which may be viscous when installed. Trim bezel 620 preferably does not contact optical material 622, but rather "floats" with leadframe 612 without damaging the optical material. Potting dam 648 may be formed by any or all of base contact 614, annular contact 616 and insulating member 618.

In one embodiment, lens 644 cooperates with leadframe 612 and die cup 624 to define a cavity 650 for optical material 622. In some embodiments optical material 622 may completely fill cavity 650 such that the optical material comes into contact with lens 644. Alternatively, lens 644 may be separated from optical material 622 by a gap or space.

Lens 644 may optionally be further adapted to provide various optical effects. For example, depending upon the molded shape of lens 644, the optical output of LED package 610 may be modified to produce a different configuration, pattern, or geometry of the emitted light pattern. Optional embodiments of lens 640 may include, without limitation, an optical geometry to diffuse illumination from the LED die; an optical pattern to diffuse illumination from the LED die; an optical geometry to produce a desired light pattern; an optical pattern to produce a desired light pattern; dispersants to diffuse output light; and addition of light excitable or photo-reactive material.

Optical material 622 provides protection for LED die 621 and for wire bond 632 that provides a second electrical connection between the LED die, extending between the LED die and annular contact 616. Optical material 622 also provides improved light extraction from LED die 621. The index of refraction for optical material 622 preferably is greater than air (which has an index of refraction of 1.0) and less than that of the LED die (typically having an index of refraction of about 1.7 to 2.2, depending on die material) to reduce Fresnel losses associated with light traveling from a material of higher index of refraction to a lower index of refraction. A preferred optical material 622 has an index located approximately centrally between the two indices (about 1.35 to 1.6).

Optical material 622 may comprise a plurality of layers, each of which may have the same or differing indexes of refraction. The layers may be deposited so as to provide a gradual transition in index of refraction from LED die 621 to the air. The layers of optical material 622 may have differing indices of refraction with the highest index being located close to LED die 621 and the lowest index located furthest from the LED die. Accordingly, it is preferable that the layers of optical material 622 are deposited such that their indices transition from high index to low index. The layers of optical material 622 may generally be the same thickness to minimize optical distortion. Alternatively, a controlled variation in thickness can be utilized to shape the optical output of LED die 621 into a desired beam pattern.

Optical material 622 may be any of viscous, non-viscous, gel, thixotropic, thermoset elastomeric, fluid, grease-like or rigid consistencies. For example, optical material 622 may comprise at least one of a non-resilient material, grease, non-liquid material, resilient material, rigid material, liquid material, silicone material, polymer, and a UV stable material. When optical material 622 is comprised of layers of materials having differing hardnesses, softer materials are preferably placed proximate LED die 621 and wire bond 632. Harder materials are preferably placed proximate the outer surface of LED package 610 so as to provide protection for the LED package during handling and operation.

In one embodiment of the present invention optical material 622 may include a light excitable or photo-reactive material, such as a phosphor material. The phosphor material may be excited by the light emitted by LED die 621 to emit a different wavelength or a spectrum of wavelengths of light. The combination of these wavelengths are combined to create white light or any other desired color, such as pink.

To assemble LED package 610, LED die 621 is mounted to die cup 624 in any conventional manner, including those discussed above with regard to LED die 16. A first electrical connection is made between LED die 621 and base contact 614, coupling one of the anode or cathode electrical interface of the LED die to the base contact. Leadframe 612 is coupled to base contact 614 in any conventional manner, such as molding, adhesives, press-fit and snap-fit. A first end of bonding wire 632 is connected to the remaining electrical interface of LED die 621, and a second end of the wire bond is connected to annular contact 616. Trim bezel 620 is connected to leadframe 612 by coupling the tabs 638 of the trim bezel to the receiving members 640 of the leadframe. Optical material 622 is applied in a manner previously discussed, covering LED die 621. It should be noted that the order of assembly of the components of LED package 610 is not critical, and may be rearranged as desired to suit various manual and automated manufacturing processes.

Complementary coupling device 611 includes at least one electrical contact 634 that is electrically insulated from thread 625. It should be noted that the "complementary coupling device" 611 of FIGS. 18 and 19 is intended to generally describe, without limitation, any object, device or system to which LED package 610 may be coupled. Complementary coupling device 611 may optionally include a conventional thermal heat sinking portion such as fins (not shown) to further aid in carrying away heat generated by LED die 621.

In operation, LED package 610 is inserted into complementary coupling device 611 by inserting dog point 628 into a receiving opening of the complementary coupling device. Threads 624 are engaged with corresponding mating threads 625 of complementary coupling device 611, and thus LED package 610 is rotated to screw the LED package into the complementary coupling device until spring contacts 630 make contact with mating contacts 634 on the complementary coupling device. Electrical power of a suitable voltage, current and polarity is applied to threads 625 and contacts 634, causing LED die 621 to emit light of a predetermined chromaticity, beam pattern and intensity.

Figure 22A:
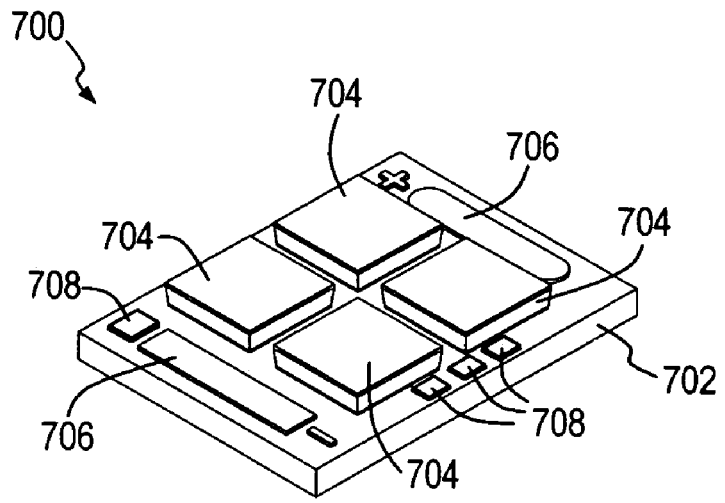
FIG. 22A is a perspective view of a substrate having a plurality of LED dice.
Figure 22B:
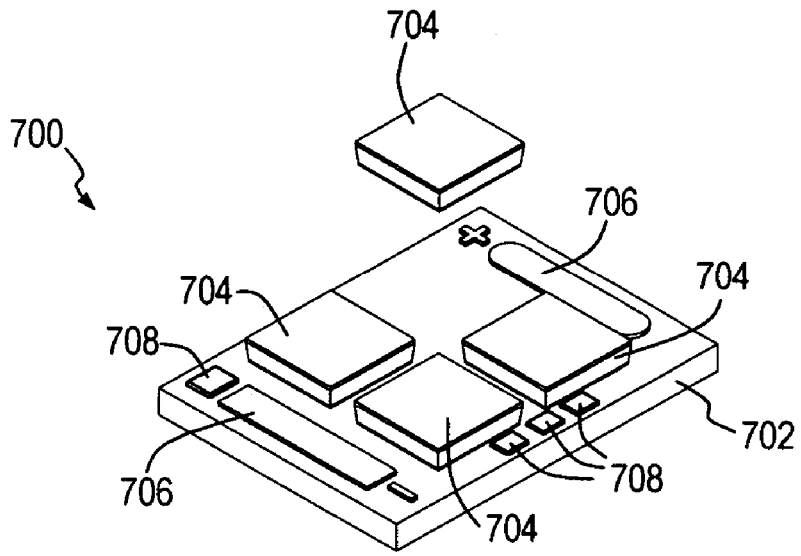
FIG. 22B is another perspective view of the substrate of FIG. 22A.

In the various embodiments of FIGS. 1–21, LED dice 16 and 621 may be replaced with an LED subassembly 700, as shown in FIGS. 22A and 22B. LED subassembly 700 includes a substrate 702, one or more LED dice 704 and one or more electrical contacts 706. LED subassembly 700 may optionally further include one or more ancillary components 708, such as resistor, capacitors, transducers and transistors.

Substrate 702 may be made of any suitable material. In one embodiment substrate 702 is a conventional rigid or flexible printed circuit board having one or more layers of conductive patterns to electrically interconnect LED dice 704, electrical contacts 706 and ancillary components 708. In other embodiments LED subassembly 700 is a hybrid wherein at least some of LED dice 704, electrical contacts 706 and/or ancillary components 708 are formed as part of a conventional thin or thick-film hybrid fabrication process upon a substrate 702 that is a semiconductor material.

LED dice 704 and ancillary components 708 may be conventional leaded or surface-mounted devices ("SMD"). Likewise, electrical contacts 706 may be contact pads for bonding or soldering electrical connections, or may be in the form of a connector.

It will be recognized by one skilled in the art that the various embodiments and features disclosed above with regard to FIGS. 1–17 including, but not limited to, spring contacts having a differing diametral pitch, embodiments wherein the LED die is a plurality of LED dice, a segmented annular contact, LED contact connections, types and styles of base contacts, and coupling of the LED die to the base contact are all equally applicable to LED package 610. Accordingly, those embodiments and features will not be repeated here.

The various embodiments have been described in detail with respect to specific embodiments thereof, but it will be apparent that numerous variations and modifications are possible without departing from the spirit and scope of the embodiments as defined by the following claims.

What is claimed is:

1. An LED package, comprising:
    a leadframe comprising a base contact and an annular contact, the contacts being separated by an insulating member; and
    an LED die coupled to the base contact and the annular contact,
    wherein the LED package includes means for detachably coupling to at least one of a mounting device, a receiving device and a complementary coupling device.

2. The LED package of claim 1, further comprising an optical material disposed over the LED die.

3. The LED package of claim 2 wherein the optical material comprises a plurality of layers.

4. The LED package of claim 2 wherein the optical material includes a light excitable material.

5. The LED package of claim 2 wherein the optical material is at least one of a non-resilient material, grease, non-liquid material, resilient material, rigid material, liquid material, silicone material, polymer, and a UV stable material.

6. The LED package of claim 2 wherein the leadframe further comprises a potting dam to retain the optical material.

7. The LED package of claim 1, further including a trim bezel coupled to the leadframe.

8. The LED package of claim 7 wherein the trim bezel further includes a reflective surface.

9. The LED package of claim 7 wherein the trim bezel is a predetermined color to generally indicate the color of light emitted by the LED die.

10. The LED package of claim 1 wherein the base contact further comprises a die cup into which the LED die is coupled.

11. The LED package of claim 1 wherein the base contact comprises a threaded portion, and wherein the threaded portion is used to detachably couple the LED package to at least one of a mounting device, a receiving device and a complementary coupling device.

12. The LED package of claim 1 wherein the base contact further includes a dog point.

13. The LED package of claim 1 wherein the leadframe further includes at least one spring contact.

14. The LED package of claim 13 wherein a plurality of spring contacts each have a differing diametral pitch.

15. The LED package of claim 1 wherein the leadframe further includes a potting dam.

16. The LED package of claim 1, further comprising a lens disposed over the LED die.

17. The LED package of claim 16, further comprising optical material at least partially filling a cavity defined by the lens, the leadframe and a die cup.

18. The LED package of claim 16 wherein the lens comprises an optical geometry to diffuse illumination from the LED die.

19. The LED package of claim 16 wherein the lens comprises an optical pattern to diffuse illumination from the LED die.

20. The LED package of claim 16 wherein the lens comprises an optical geometry to produce a desired light pattern.

21. The LED package of claim 16 wherein the lens comprises an optical pattern to produce a desired light pattern.

22. The LED package of claim 16 wherein a portion of the lens comprises dispersants to diffuse output light.

23. The LED package of claim 16 wherein a portion of the lens comprises light excitable material.

24. The LED package of claim 1 wherein the LED die is comprised of a plurality of LED dice.

25. The LED package of claim 24 wherein the annular contact is separated into two or more segments to provide isolated electrical contact to each LED die.

26. The LED package of claim 24 wherein the LED die is electrically insulated from the base contact and the LED die contains both P-type and N-type contacts on the top surface of the die such that the LED die can be electrically connected in series via wire bonding.

27. The LED package of claim 1 wherein the LED die is coupled to the base contact with a thermally and electrically conductive adhesive.

28. The LED package of claim 1 wherein the LED die is affixed to the base contact with a thermally conductive adhesive and the LED die is electrically coupled to the base contact with wire bonding.

29. An LED package, comprising:
    a leadframe comprising a base contact and an annular contact, the contacts being separated by an insulating member, wherein the base contact has a die cup for coupling to an LED die and further includes a threaded portion to detachably couple the LED package to at least one of a mounting device, a receiving device and a complementary coupling device;
an LED die coupled to the die cup and the annular contact;
an optical material disposed over the LED die; and
a trim bezel coupled to the leadframe.

30. The LED package of claim 29 wherein the trim bezel further includes a reflective surface.

31. The LED package of claim 29 wherein the trim bezel is a predetermined color to generally indicate the color of light emitted by the LED die.

* * * * *

UNITED STATES PATENT AND TRADEMARK OFFICE
CERTIFICATE OF CORRECTION

PATENT NO. : 7,138,667 B2
APPLICATION NO. : 11/114991
DATED : November 21, 2006
INVENTOR(S) : Thomas J. Barnett and Sean P. Tillinghast It is certified that error appears in the above-identified patent and that said Letters Patent is hereby corrected as shown below:

In Column 15, Line 38, add the following text after the words "repeated here."

--Furthermore, in the various embodiments of Figs. 1-21 the LED package may utilize any of the means disclosed herein for detachably coupling to at least one of a mounting device, a receiving device and a complementary coupling device as detailed above, including, without limitation, one or more of lens protrusions 32 (see, e.g., Figs. 2, 3 and 5); bayonet protrusions 470 (Figs. 15A, 15B); and threads 570, 626 (Figs. 16A, 16B, 18 and 19)--.

Signed and Sealed this

Ninth Day of January, 2007

JON W. DUDAS
*Director of the United States Patent and Trademark Office*